United States Patent
Ogihara et al.

(10) Patent No.: US 8,652,267 B2
(45) Date of Patent: Feb. 18, 2014

(54) COATED-TYPE SILICON-CONTAINING FILM STRIPPING PROCESS

(75) Inventors: Tsutomu Ogihara, Jyoetsu (JP);
Takafumi Ueda, Jyoetsu (JP);
Toshiharu Yano, Jyoetsu (JP); Shozo Shirai, Jyoetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 565 days.

(21) Appl. No.: 12/591,115

(22) Filed: Nov. 9, 2009

(65) Prior Publication Data
US 2010/0147334 A1 Jun. 17, 2010

(30) Foreign Application Priority Data
Dec. 11, 2008 (JP) .................. 2008-315994

(51) Int. Cl.
*B08B 3/00* (2006.01)
(52) U.S. Cl.
USPC .............. 134/26; 134/27; 134/28; 134/29
(58) Field of Classification Search
None
See application file for complete search history.

(56) References Cited

U.S. PATENT DOCUMENTS

| | | | |
|---|---|---|---|
| 2002/0187422 A1 | 12/2002 | Angelopoulos et al. | |
| 2004/0154641 A1 | 8/2004 | Montierth | |
| 2005/0274692 A1 | 12/2005 | Hamada et al. | |
| 2008/0138959 A1 * | 6/2008 | Yokokawa et al. | 438/458 |

FOREIGN PATENT DOCUMENTS

| | | |
|---|---|---|
| EP | 1 798 599 A1 | 6/2007 |
| JP | A 5-291208 | 11/1993 |
| JP | A-08-250400 | 9/1996 |
| JP | A-2001-015475 | 1/2001 |
| JP | A 2005-520354 | 7/2005 |

OTHER PUBLICATIONS

Sugita et al., "Spin-on-Glass (SOG) for the Trilayer Imaging Process," *Journal of Applied Polymer Science*, vol. 88, 2003, pp. 636-640.
European Search Report issued for European Application No. 09015145.7 on Mar. 29, 2010.
Office Action issued in Japanese Application No. 2008-315994 dated Feb. 22, 2011 (with partial translation).

* cited by examiner

*Primary Examiner* — Eric Golightly
(74) *Attorney, Agent, or Firm* — Oliff PLC

(57) ABSTRACT

There is disclosed a coated-type silicon-containing film stripping process for stripping off to remove a coated-type silicon-containing film obtained by coating a silicon-containing film composition used in a lithography on a substrate, comprising, at least: a first step of treating the silicon-containing film with an acidic stripping solution containing sulphate ion and/or fluoride ion; and a second step of treating the silicon-containing film with an alkaline stripping solution containing a nitrogen compound. There can be provided a process for allowing a silicon-containing film, which has not been conventionally removed unless dry stripping is adopted, to be removed by a stripping process based on a stripping solution (wet stripping).

8 Claims, No Drawings

COATED-TYPE SILICON-CONTAINING FILM STRIPPING PROCESS

BACKGROUND OF THE INVENTION

1. Field of the Invention

The present invention relates to a process for removing a silicon-containing film for lithography used for fine processing in a manufacturing process of semiconductor devices and the like.

2. Description of the Related Art

With highly integrated LSI's providing highly increased speeds, finer pattern rules are being rapidly promoted. Commensurately with the fineness, the lithography technique has attained formation of fine patterns, by virtue of light sources of shorter wavelengths and resist compositions appropriately selected therefor. The main role thereof was played by positive photoresist compositions to be each used as a monolayer. The monolayer positive photoresist composition is configured to possess, in a resist resin, a frame having an etching resistance against dry etching by chlorine-based or fluorine-based gas plasma, and to possess such a resist mechanism that an exposed portion is made dissolvable, so that the exposed portion is dissolved to thereby form a pattern, and the remaining resist pattern is used as an etching mask to dry etch a processing substrate coated with the resist composition.

However, when a pattern is made finer, i.e., pattern rules are further narrowed while keeping a thickness of a used photoresist film as it is, the photoresist film is deteriorated in resolution performance. Further, when the resist film is to be developed by a developer to form a pattern, a so-called aspect ratio thereof is made excessively large, thereby resultingly causing a pattern collapse. Thus, the fineness has been accompanied by decrease in photoresist film thickness.

Meanwhile, although for processing of a processing substrate, there is typically used a method for processing the substrate by dry etching by adopting a patterned photoresist film as an etching mask, practically no dry etching methods exist to exhibit a complete etching selectivity between a photoresist film and a processing substrate, so that the resist film is also damaged during processing of the processing substrate and the resist film is collapsed, thereby failing to accurately transfer a resist pattern onto the processing substrate. Thus, with finer patterns, resist compositions have been required to have higher dry etching resistances.

Further, since shortened wavelengths of exposure have demanded that resins having lower light absorption at exposure wavelengths are used for resist compositions, such resins have been subjected to a transitional history from a novolak resin, through polyhydroxystyrene, and to a resin having an aliphatic polycyclic frame, commensurately with a transitional history from i-beam, through KrF, and to ArF. However, etching speeds under the dry etching condition have been practically made higher, so that recent photoresist compositions having higher resolutions practically tend to be rather lowered in etching resistance.

This obliges a processing substrate to be dry etched by a photoresist film which is inevitably thinner and weaker in etching resistance, thereby making it urgent to ensure a material and a process in this processing state.

As one method to solve such a problem, multi-layer resist process have been used. The multi-layer resist process further include a three-layer resist process which can be performed by using a typical resist composition used in a monolayered resist process. For example, this method is configured to form: an organic film as a resist under layer film based on novolak or the like on a processing substrate; a silicon-containing film as a resist intermediate film, thereon; and a typical organic photoresist film as a resist upper layer film, thereon. Since the organic resist upper layer film exhibits an excellent etching selectivity ratio relative to the silicon-containing resist intermediate film for dry etching by fluorine-based gas plasma, the resist pattern is transferred to the silicon-containing resist intermediate film by means of dry etching based on fluorine-based gas plasma. According to this method, patterns of novolak films having sufficient dry etching resistances for processing can be obtained insofar as patterns can be transferred to silicon-containing films, even by adopting: a resist composition which is difficult to be formed with a pattern having a sufficient film thickness for direct processing of a processing substrate; and a resist composition having an insufficient dry etching resistance for processing of a substrate.

Examples of silicon-containing resist intermediate films to be used in the above-described three-layer resist process include; as for films obtained by spin coating, such as SOG (spin-on-glass) films (Japanese Patent Laid-Open (kokai) No. H5-291208, J. Appl. Polym. Sci., Vol. 88, 636-640 (2003), for example), and crosslinkable silsesquioxane films (Japanese translation of PCT international application No. 2005-520354, for example).

Upon usage of such films in a process for manufacturing actual semiconductor devices, defects are occasionally caused in coated films formed on wafers, thereby inevitably requiring re-processing. To strip off silicon-containing films upon such re-processing, stripping has been conventionally conducted by a method such as dry stripping based on fluorine gas, which brings about considerable damages to wafers.

Meanwhile, sulphate ion-containing stripping solutions and fluoride ion-containing stripping solutions are known as stripping solutions, which are typically used in semiconductor production processes.

Although treatment of a silicon-containing film by such a typically used sulphate ion-containing stripping solution allows the sulfuric acid to remove organic substitutional groups and organic components contained in the silicon-containing film, siloxane bonds acting as main frames of the silicon-containing film are rarely decomposed then, thereby problematically failing to complete stripping of the silicon-containing film. In turn, although treatment of a silicon-containing film by a fluoride ion-containing stripping solution allows for cleavage of siloxane bonds, this treatment requires such a condition to avoid damages of a circuit having been formed on a silicon wafer, thereby obliging to use an extremely dilute stripping solution in a normal case. This certainly enables to break siloxane bonds at portions substantially close to a surface of the silicon-containing film, while leaving a problem that a complete stripping is unachievable.

SUMMARY OF THE INVENTION

The present invention has been attained in view of the above circumstances, and it is therefore an object of the present invention to provide a process for allowing a silicon-containing film, which has not been conventionally removed unless dry stripping is adopted, to be removed by a stripping process based on a stripping solution (hereinafter called "wet stripping process").

To solve the above problem, the present invention provides a coated-type silicon-containing film stripping process for stripping off to remove a coated-type silicon-containing film obtained by coating a silicon-containing film composition used in a lithography on a substrate, comprising, at least:

a first step of treating the silicon-containing film with an acidic stripping solution containing sulphate ion and/or fluoride ion; and a second step of treating the silicon-containing film with an alkaline stripping solution containing a nitrogen compound.

In this way, the silicon-containing film having undergone certain damages to siloxane bonds thereof by the treatment by the acidic stripping solution containing sulphate ion and/or fluoride ion in the first step, is treated by the alkaline stripping solution containing the nitrogen compound in the second step, so that the siloxane bonds in the silicon-containing film are allowed to be easily broken to complete the wet stripping.

Preferably, the acidic stripping solution containing sulphate ion to be used in the first step further contains hydrogen peroxide.

In this way, the acidic stripping solution containing sulphate ion to be used in the first step further contains hydrogen peroxide, so that organic substitutional groups, organic components, and the like contained in the silicon-containing film are oxidation-decomposed by the action of the hydrogen peroxide and thus removed from the silicon-containing film. This causes the alkaline stripping solution containing the nitrogen compound to be used in the second step, to readily permeate into the silicon-containing film, thereby facilitating the stripping thereof.

Preferably, the acidic stripping solution containing fluoride ion to be used in the first step contains hydrofluoric acid and/or ammonium fluoride.

In this way, adopting the hydrofluoric acid and/or ammonium fluoride as the acidic stripping solution containing fluoride ion to be used in the first step, causes the hydrofluoric acid and/or ammonium fluoride to act on a surface of the silicon-containing film to decompose a part of siloxane bonds in the surface, thereby causing the alkaline stripping solution containing the nitrogen compound to be used in the second step, to readily permeate into the silicon-containing film, thereby facilitating the stripping thereof.

Preferably, the alkaline stripping solution containing the nitrogen compound to be used in the second step contains at least one of ammonia, organic amine, and tetraalkyl ammonium.

In this way, when the alkaline stripping solution to be used in the second step is configured to contain at least one of ammonia, organic amine, and tetraalkyl ammonium, the wet stripping can be readily completed.

Preferably, the alkaline stripping solution containing the nitrogen compound to be used in the second step further contains hydrogen peroxide.

In this way, when the alkaline stripping solution containing the nitrogen compound to be used in the second step is configured to further contain hydrogen peroxide, organic substitutional groups, organic components, and the like contained in the silicon-containing film are oxidation-decomposed by the action of the hydrogen peroxide and thus removed from the silicon-containing film. This causes the alkaline stripping solution containing the nitrogen compound to readily permeate into the silicon-containing film, thereby further accelerating the stripping thereof.

Preferably, the stripping process further comprises steps of removing the stripping solutions used in the first step and the second step, after the steps, respectively.

Since the stripping solutions used in the respective steps are occasionally deteriorated in stripping abilities when the stripping solutions were carried over to next steps, cleaning is to be preferably conducted such as by pure water to fully remove the stripping solutions after completion of the respective steps, and then transference to the next step is to be conducted.

Preferably, the second step for treating the silicon-containing film by the alkaline stripping solution containing the nitrogen compound is configured to use the stripping solution containing the nitrogen compound at a temperature of 50° C. to 90° C.

In this way, the alkaline stripping solution containing the nitrogen compound to be used in the second step is set at a temperature of 50° C. to 90° C., thereby enabling to readily strip off the silicon-containing film.

Thus, the wet stripping process of the present invention allows for silicon-containing films for lithography to be readily removed without breaking patterns on substrates, which have been subjected to the most-advanced fine processing.

DETAILED DESCRIPTION OF THE PREFERRED EMBODIMENTS

The present invention will be explained more specifically.

As described above, although dry stripping based on fluorine gas has been conventionally conducted as a process to strip off a silicon-containing film preferably used in a multi-layer resist method, the dry stripping has brought about a problem of increased damages to wafers.

Further, although sulphate ion-containing stripping solutions, fluoride ion-containing stripping solutions, and the like are known as stripping solutions having been conventionally used in semiconductor production processes, conduction of stripping of silicon-containing films by these stripping solutions is susceptible to cause stripping residues, thereby failing to achieve a complete stripping of silicon-containing films.

In this way, it has been demanded to provide a silicon-containing film stripping process capable of completely stripping off a silicon-containing film to be used in a multi-layer resist method, with decreased damages to a wafer upon stripping of the silicon-containing film.

Then, the present inventors have earnestly investigated a wet stripping process of a silicon-containing film to be used for lithography, and narrowly found out that siloxane bonds in the silicon-containing film can be readily broken and stripping can be completed without damaging a wafer, by a silicon-containing film stripping process comprising, at least, a first step of treating the silicon-containing film with an acidic stripping solution containing sulphate ion and/or fluoride ion, and a second step of treating the silicon-containing film with an alkaline stripping solution containing a nitrogen compound.

Examples of a concentration of a sulfuric acid contained in the sulphate ion-containing stripping solution to be used in the first step of the present invention, are preferably 0.1 to 98%, and more preferably 1 to 90%. The acidic stripping solution to be used in the first step is configured to further contain hydrogen peroxide, so that organic substitutional groups, organic components, and the like contained in the silicon-containing film are oxidation-decomposed by the action of the hydrogen peroxide and thus removed from the silicon-containing film. This causes the alkaline stripping solution containing the nitrogen compound to be used in the second step, to readily permeate into the silicon-containing film, thereby facilitating the stripping thereof. Here, hydrogen peroxide contained in the acidic stripping solution of the first step, is provided at a mass ratio of sulfuric acid:hydrogen peroxide=1:1/1,000 to 1:1,000, preferably sulfuric acid:hydrogen peroxide=1:1/500 to 1:500, relative to sulfuric acid in the acidic stripping solution.

The treatment temperature is to be 0° C. to 200° C., preferably 10° C. to 180° C., and more preferably 20° C. to 150° C. The treatment time is to be 1 second to 1 hour, and preferably on the order of 10 seconds to 30 minutes. Since these conditions are varied depending on a type of actual circuit formed on a wafer, semiconductor device production process conditions, and the like, the conditions are not limited to those described just above.

Further, preferable as the acidic stripping solution containing fluoride ion to be used in the first step of the present invention, are those containing hydrofluoric acid and/or ammonium fluoride. Examples of a concentration of the hydrofluoric acid are preferably 0.1 to 40%, and more preferably 0.5 to 30%, in mass concentration. Here, ammonium fluoride to be contained in the acidic stripping solution is provided at a mass ratio of hydrofluoric acid:ammonium fluoride=1:1/1,000 to 1:1000, and preferably hydrofluoric acid:ammonium fluoride=1:1/500 to 1:500, relative to hydrofluoric acid in the acidic stripping solution. The treatment temperature is 0° C. to 150° C., and preferably 10° C. to 120° C. While the treatment time is to be 1 second to 1 hour, and preferably on the order of 10 seconds to 30 minutes; these conditions are varied depending on a type of actual circuit formed on a wafer, and the like, so that the conditions are not limited to those described just above. In this way, adopting the hydrofluoric acid and/or ammonium fluoride in the first step, decomposes a part of siloxane bonds in a surface of the silicon-containing film, thereby preferably causing the alkaline stripping solution containing the nitrogen compound to be used in the second step, to readily permeate into the silicon-containing film.

Moreover, preferable as the alkaline stripping solution containing the nitrogen compound to be used in the second step of the present invention, are those containing at least one of ammonia, organic amine, and tetraalkyl ammonium. Concrete examples include ammonia, methylamine, dimethylamine, trimethylamine, tetramethylammonium hydroxide, ethylamine, diethylamine, triethylamine, tetraethylammonium hydroxide, propylamine, dipropylamine, tripropylamine, tetrapropylammonium hydroxide, butylamine, dibutylamine, tributylamine, and tetrabutylammonium hydroxide. Examples of preferable concentrations of these compounds in aqueous solutions are preferably 0.1 to 40%, and more preferably 0.5 to 30%, in mass concentration. Further, when the alkaline stripping solution containing the nitrogen compound to be used in the second step is configured to additionally contain hydrogen peroxide, organic substitutional groups, organic components, and the like contained in the silicon-containing film are oxidation-decomposed by the action of the hydrogen peroxide and thus removed from the silicon-containing film, to preferably cause the alkaline stripping solution containing the nitrogen compound to readily permeate into the silicon-containing: film, thereby further accelerating the stripping thereof. Here, hydrogen peroxide to be contained in the stripping solution to be used in the second step is provided at a mass ratio of nitrogen-containing compound:hydrogen peroxide=1:1/1,000 to 1:1000, and preferably nitrogen-containing compound:hydrogen peroxide=1:1/500 to 1:500, relative to the nitrogen-containing compound in the stripping solution. The treatment temperature is 0° C. to 100° C., preferably 10° C. to 90° C., and more preferably 50° C. to 90° C. While the treatment time is to be 1 second to 1 hour, and preferably on the order of 10 seconds to 30 minutes; these conditions are varied depending on a type of actual circuit formed on a wafer, and the like, so that the conditions are not limited to those described just above.

The cleaning to be conducted after the respective steps (first step and second step) conforms to a method to be typically used in a semiconductor wafer cleaning step. For example, it is possible to select a cleaning method, such as cleaning by pure water (pure water rinsing), cleaning by ultrasonic waves (ultrasonic rinsing), cleaning by organic solvent, or the like, which is capable of completely removing a used stripping solution without damaging a circuit on a wafer.

As a silicon-containing film composition for forming a silicon-containing film for lithography as a stripping target in the present invention, it is possible to adopt a silicon-containing compound to be obtained by hydrolytic condensation of a hydrolyzable silicon compound (hereinafter called "monomer") with an acid catalyst. Examples of a production method of the silicon-containing compound include the following ones, without limited thereto.

The monomer as the starting materials can be represented by the following general formula (1):

$$R^1{}_{m1}R^2{}_{m2}R^3{}_{m3}Si(Or)_{(4-m1-m2-m3)} \tag{1}$$

wherein R is an alkyl group having 1 to 3 carbon atoms;
$R^1$, $R^2$, and $R^3$ may be the same or different one another, and represent a hydrogen atom or a monovalent organic group having 1 to 30 carbon atoms;
m1, m2, and m3 are 0 or 1; and
m1+m2+m3 is an integer from 0 to 3, preferably 0 or 1.

As for the silicon-containing film composition as a stripping target in the present invention, the silicon-containing compound obtained by hydrolyzing and condensing one kind monomer represented by this general formula (1), or mixture of two or more kinds of monomers represented by this general formula (1) can be used.

Herein, the term "organic group" means a group, which includes carbon, and which may additionally include hydrogen, as well as nitrogen, oxygen, sulfur, silicon or the like. Examples of the organic groups represented by $R^1$, $R^2$, and $R^3$ include: unsubstituted monovalent hydrocarbon groups, such as linear, branched or cyclic alkyl, alkenyl, alkynyl, aryl and aralkyl groups; substituted groups, which one or more hydrogen atoms of the above groups are substituted with an epoxy group, alkoxy group, hydroxy group, or the like; groups exemplarily represented by the general formula (2) to be shown later, including intervening groups such as —O—, —CO—, —OCO—, —COO—, or —OCOO—; and organic groups including a silicon-silicon bond.

Suitable as $R^1$, $R^2$, and $R^3$ in the monomers represented by the general formula (1) are: a hydrogen atom; alkyl groups such as methyl, ethyl, n-propyl, iso-propyl, n-butyl, iso-butyl, sec-butyl, t-butyl, n-pentyl, 2-ethylbutyl, 3-ethylbutyl, 2,2-diethylpropyl, cyclopentyl, n-hexyl, and cyclohexyl groups; alkenyl groups such as vinyl and allyl groups; alkynyl groups such as ethynyl group; and, as light-absorbing groups, aryl groups such as phenyl and tolyl groups, and aralkyl groups such as benzyl and phenethyl groups.

Examples of tetraalkoxysilanes as monomers where m1=0, m2=0 and m3=0 include tetramethoxysilane, tetraethoxysilane, tetra-n-propoxysilane, and tetraisopropoxysilane. Tetramethoxysilane and tetraethoxysilane are preferable among them.

Examples of trialkoxysilanes where m1=1, m2=0 and m3=0 include trimethoxysilane, triethoxysilane, tri-n-propoxysilane, triisopropoxysilane, methyltrimethoxysilane, methyltriethoxysilane, methyltri-n-propoxysilane, methyltri-isopropoxysilane, ethyltrimethoxysilane, ethyltriethoxysilane, ethyltri-n-propoxysilane, ethyltriisopropoxysilane, vinyltrimethoxysilane, vinyltriethoxysilane, vinyltri-n-propoxysilane, vinyltriisopropoxysilane, n-propyltrimethoxysilane, n-propyltriethoxysilane, n-propyltri-n-propoxysilane, n-propyltriisopropoxysilane, i-propyltrimethoxysilane, i-propyltriethoxysilane, i-propyltri-n-propoxysilane, i-propyltriisopropoxysilane, n-butyltrimethoxysilane, n-butyltriethoxysilane, n-butyltri-n-propoxysilane, n-butyltriisopropoxysilane, sec-butyltrimethoxysilane, sec-butyltriethoxysilane, sec-butyltri-n-propoxysilane, sec-butyltriisopropoxysilane, t-butyltrimethoxysilane, t-butyltriethoxysilane, t-butyltri-n-propoxysilane, t-butyltriisopropoxysilane, cyclopropyltrimethoxysilane, cyclopropyltriethoxysilane, cyclopropyltri-n-propoxysilane, cyclopropyltriisopropoxysilane, cyclobutyltrimethoxysilane, cyclobutyltriethoxysilane, cyclobutyltri-n-propoxysilane, cyclobutyltriisopropoxysilane, cyclopentyltrimethoxysilane, cyclopentyltriethoxysilane, cyclopentyltri-n-propoxysilane, cyclopentyltriisopropoxysilane, cyclohexyltrimethoxysilane, cyclohexyltriethoxysilane, cyclohexyltri-n-propoxysilane, cyclohexyltriisopropoxysilane, cyclohexenyltrimethoxysilane, cyclohexenyltriethoxysilane, cyclohexenyltri-n-propoxysilane, cyclohexenyltriisopropoxysilane, cyclohexenylethyltrimethoxysilane, cyclohexenylethyltriethoxysilane, cyclohexenylethyltri-n-propoxysilane, cyclohexenylethyltriisopropoxysilane, cyclooctanyltrimethoxysilane, cyclooctanyltriethoxysilane, cyclooctanyltri-n-propoxysilane, cyclooctanyltriisopropoxysilane, cyclopentadienylpropyltrimethoxysilane, cyclopentadienylpropyltriethoxysilane, cyclopentadienylpropyltri-n-propoxysilane, cyclopentadienylpropyltriisopropoxysilane, bicycloheptenyltrimethoxysilane, bicycloheptenyltriethoxysilane, bicycloheptenyltri-n-propoxysilane, bicycloheptenyltriisopropoxysilane, bicycloheptyltrimethoxysilane, bicycloheptyltriethoxysilane, bicycloheptyltri-n-propoxysilane, bicycloheptyltriisopropoxysilane, adamantyltrimethoxysilane, adamantyltriethoxysilane, adamantyltri-n-propoxysilane, and adamantyltriisopropoxysilane. Further, examples of light-absorbing monomers in this respect include phenyltrimethoxysilane, phenyltriethoxysilane, phenyltri-n-propoxysilane, phenyltriisopropoxysilane, benzyltrimethoxysilane, benzyltriethoxysilane, benzyltri-n-propoxysilane, benzyltriisopropoxysilane, tolyltrimethoxysilane, tolyltriethoxysilane, tolyltri-n-propoxysilane, tolyltriisopropoxysilane, phenethyltrimethoxysilane, phenethyltriethoxysilane, phenethyltri-n-propoxysilane, phenethyltriisopropoxysilane, naphthyltrimethoxysilane, naphthyltriethoxysilane, naphthyltri-n-propoxysilane, and naphthyltriisopropoxysilane.

Preferable examples of trialkoxysilanes include methyltrimethoxysilane, methyltriethoxysilane, ethyltrimethoxysilane, ethyltriethoxysilane, vinyltrimethoxysilane, vinyltriethoxysilane, n-propyltrimethoxysilane, n-propyltriethoxysilane, isopropyltrimethoxysilane, isopropyltriethoxysilane, n-butyltrimethoxysilane, n-butyltriethoxysilane, isobutyltrimethoxysilane, isobutyltriethoxysilane, allyltrimethoxysilane, allyltriethoxysilane, cyclopentyltrimethoxysilane, cyclopentyltriethoxysilane, cyclohexyltrimethoxysilane, cyclohexyltriethoxysilane, cyclohexenyltrimethoxysilane, cyclohexenyltriethoxysilane, phenyltrimethoxysilane, phenyltriethoxysilane, benzyltrimethoxysilane, benzyltriethoxysilane, phenethyltrimethoxysilane, and phenethyltriethoxysilane.

Examples of dialkoxysilanes where m1=1, m2=1 and m3=0 include dimethyldimethoxysilane, dimethyldiethoxysilane, methylethyldimethoxysilane, methylethyldiethoxysilane, dimethyldi-n-propoxysilane, dimethyldiisopropoxysilane, diethyldimethoxysilane, diethyldiethoxysilane, diethyldi-n-propoxysilane, diethyldiisopropoxysilane, di-n-propyldimethoxysilane, di-n-propyldiethoxysilane, di-n-propyl-di-n-propoxysilane, di-n-propyldiisopropoxysilane, diisopropyldimethoxysilane, diisopropyldiethoxysilane, diisopropyldi-n-propoxysilane, diisopropyldiisopropoxysilane, di-n-butyldimethoxysilane, di-n-butyldiethoxysilane, di-n-butyldi-n-propoxysilane, di-n-butyldiisopropoxysilane, di-sec-butyldimethoxysilane, di-sec-butyldiethoxysilane, di-sec-butyldi-n-propoxysilane, di-sec-butyldiisopropoxysilane, di-t-butyldimethoxysilane, di-t-butyldiethoxysilane, di-t-butyldi-n-propoxysilane, di-t-butyldiisopropoxysilane, dicyclopropyldimethoxysilane, dicyclopropyldiethoxysilane, dicyclopropyldi-n-propoxysilane, dicyclopropyldiisopropoxysilane, dicyclobutyldimethoxysilane, dicyclobutyldiethoxysilane, dicyclobutyldi-n-propoxysilane, dicyclobutyldiisopropoxysilane, dicyclopentyldimethoxysilane, dicyclopentyldiethoxysilane, dicyclopentyldi-n-propoxysilane, dicyclopentyldiisopropoxysilane, dicyclohexyldimethoxysilane, dicyclohexyldiethoxysilane, dicyclohexyldi-n-propoxysilane, dicyclohexyldiisopropoxysilane, dicyclohexenyldimethoxysilane, dicyclohexenyldiethoxysilane, dicyclohexenyldi-n-propoxysilane, dicyclohexenyldiisopropoxysilane, dicyclohexenylethyldimethoxysilane, dicyclohexenylethyldiethoxysilane, dicyclohexenylethyldi-n-propoxysilane, dicyclohexenylethyldiisopropoxysilane, dicyclooctanyldimethoxysilane, dicyclooctanyldiethoxysilane, dicyclooctanyldi-n-propoxysilane, dicyclooctanyldiisopropoxysilane, dicyclopentadienylpropyldimethoxysilane, dicyclopentadienylpropyldiethoxysilane, dicyclopentadienylpropyldi-n-propoxysilane, dicyclopentadienylpropyldiisopropoxysilane, bisbicycloheptenyldimethoxysilane, bisbicycloheptenyldiethoxysilane, bisbicycloheptenyldi-n-propoxysilane, bisbicycloheptenyldiisopropoxysilane, bisbicycloheptyldimethoxysilane, bisbicycloheptyldiethoxysilane, bisbicycloheptyldi-n-propoxysilane, bisbicycloheptyldiisopropoxysilane, bisadamantyldimethoxysilane, bisadamantyldiethoxysilane, bisadamantyldi-n-propoxysilane, and bisadamantyldiisopropoxysilane. Further, examples of light-absorbing monomers in this respect include diphenyldimethoxysilane, diphenyldiethoxysilane, methylphenyldimethoxysilane, methylphenyldiethoxysilane, diphenyldi-n-propoxysilane, and diphenyldiisopropoxysilane.

Preferable examples of dialkoxysilanes include dimethyldimethoxysilane, dimethyldiethoxysilane, diethyldimethoxysilane, diethyldiethoxysilane, methylethyldimethoxysilane, methylethyldiethoxysilane, di-n-propyldimethoxysilane, di-n-butyldimethoxysilane, methylphenyldimethoxysilane, and methylphenyldiethoxysilane.

Examples of monoalkoxysilanes where m1=1, m2=1 and m3=1 include trimethylmethoxysilane, trimethylethoxysilane, dimethylethylmethoxysilane, and dimethylethylethoxysilane. Further, examples of light-absorbing monomers in this respect include dimethylphenylmethoxysilane, dimethylphenylethoxysilane, dimethylbenzylmethoxysilane, dimethylbenzylethoxysilane, dimethylphenethylmethoxysilane, and dimethylphenethylethoxysilane.

Preferable examples of monoalkoxysilanes include trimethylmethoxysilane, dimethylethylmethoxysilane, dimethylphenylmethoxysilane, dimethylbenzylmethoxysilane, and dimethylphenethylmethoxysilane.

Other examples of the organic groups represented by $R^1$, $R^2$, and $R^3$ include organic groups having one or more carbon-oxygen single bonds or carbon-oxygen double bonds. Concrete examples include organic groups having one or more groups selected from a group consisting of epoxy, ester, alkoxy, and hydroxyl groups. Examples of organic groups having one or more carbon-oxygen single bonds or carbon-oxygen double bonds in the general formula (1) include those represented by the following general formula (2):

$$(P\text{-}Q_1\text{-}(S_1)_{v1}\text{-}Q_2\text{-})_u\text{-}(T)_{v2}\text{-}Q_3\text{-}(S_2)_{v3}\text{-}Q_4\text{-} \quad (2)$$

wherein P is a hydrogen atom, hydroxyl group,

an alkoxy group having 1 to 4 carbon atoms, alkylcarbonyloxy group having 1 to 6 carbon atoms, or alkylcarbonyl group having 1 to 6 carbon atoms;

$Q_1$, $Q_2$, $Q_3$, and $Q_4$ are independently $-C_qH_{(2q-p)}P_p-$ (where P is the same as the above, p is an integer of 0 to 3, and q is an integer of 0 to 10 (q=0 represents a single bond));

u is an integer of 0 to 3;

$S_1$ and $S_2$ independently represent —O—, —CO—, —OCO—, —COO—, or —OCOO—; and v1, v2, and v3 independently represent 0 or 1.

Simultaneously with the above, T is a divalent group comprising an alicycle or aromatic ring which may contain a heteroatom, and examples of alicycles or aromatic rings of T which may include a heteroatom such as oxygen atoms in T are listed below. Those sites of T which are bonded to $Q_2$ and $Q_3$ are not particularly limited, and such sites may be appropriately selected in view of reactivities based on steric factors and availabilities of commercial reagents to be used in the reaction).

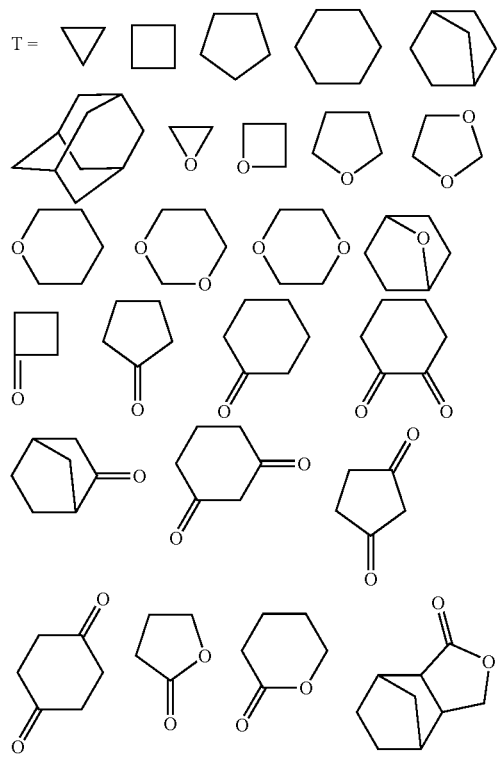

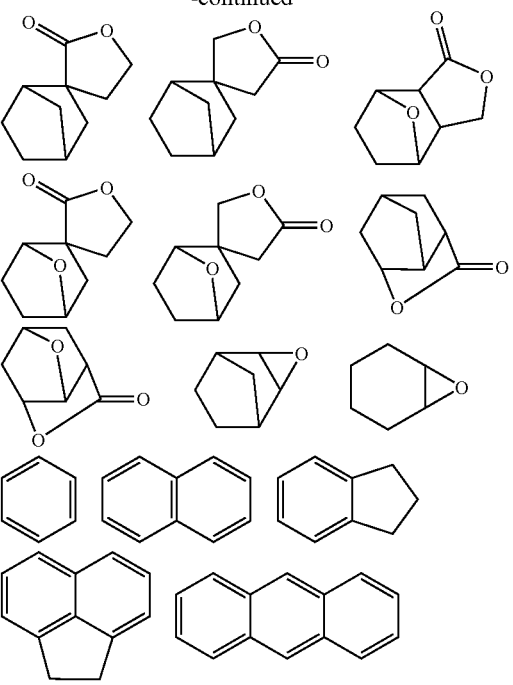

Preferable examples of organic groups in the general formula (2) having one or more carbon-oxygen single bonds or carbon-oxygen double bonds, include the following. Note that the following formulae include a symbol "(Si)" depicted to show a bonding site to Si.

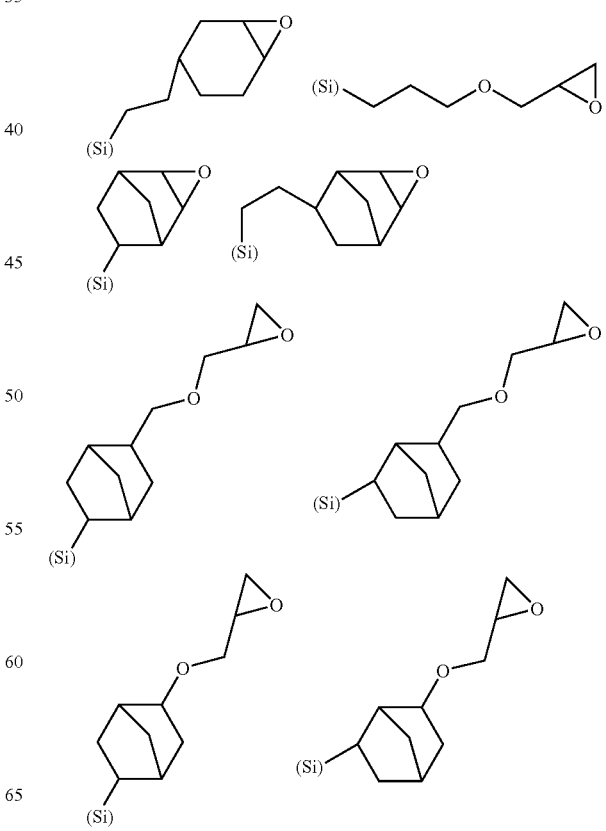

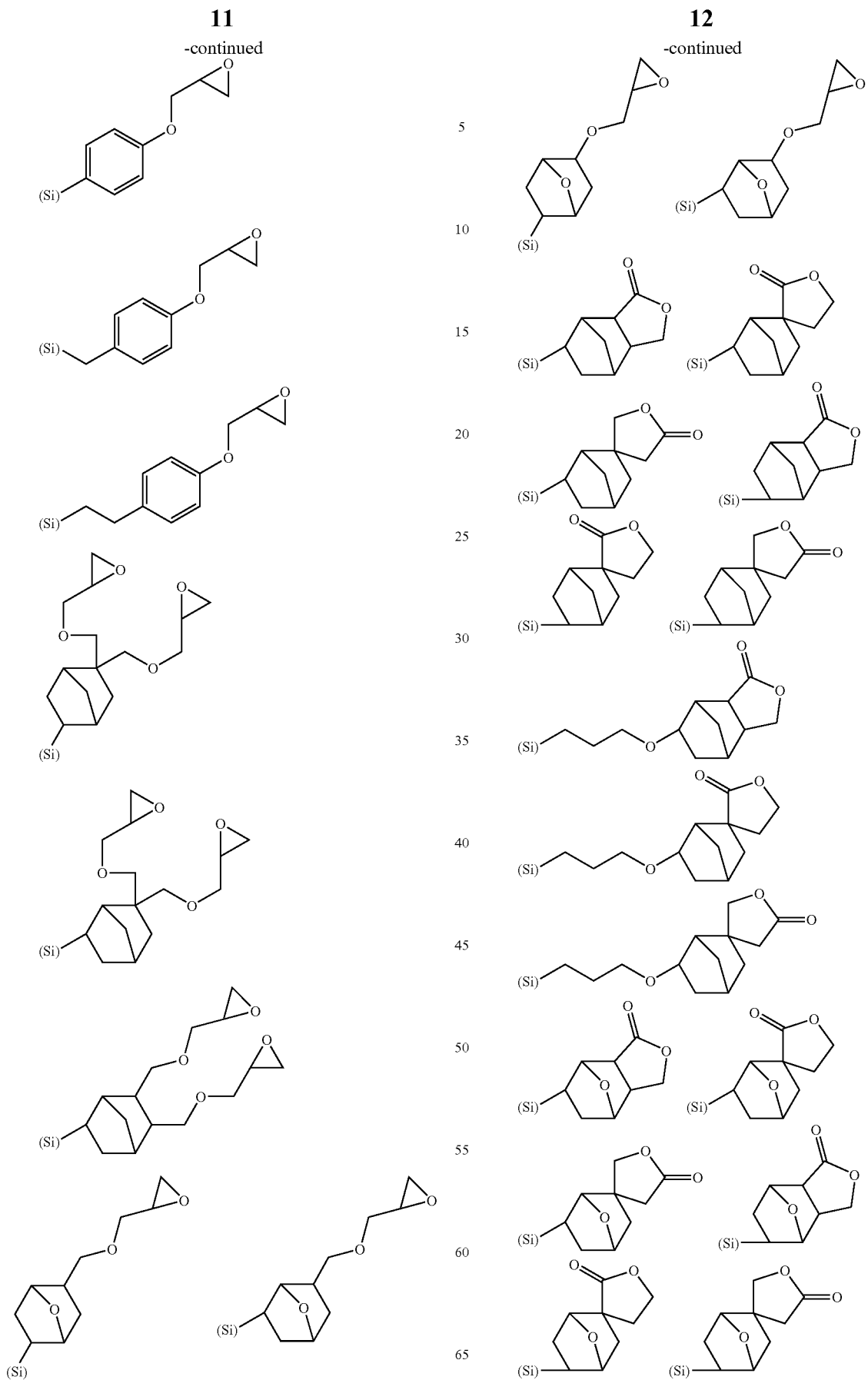

-continued
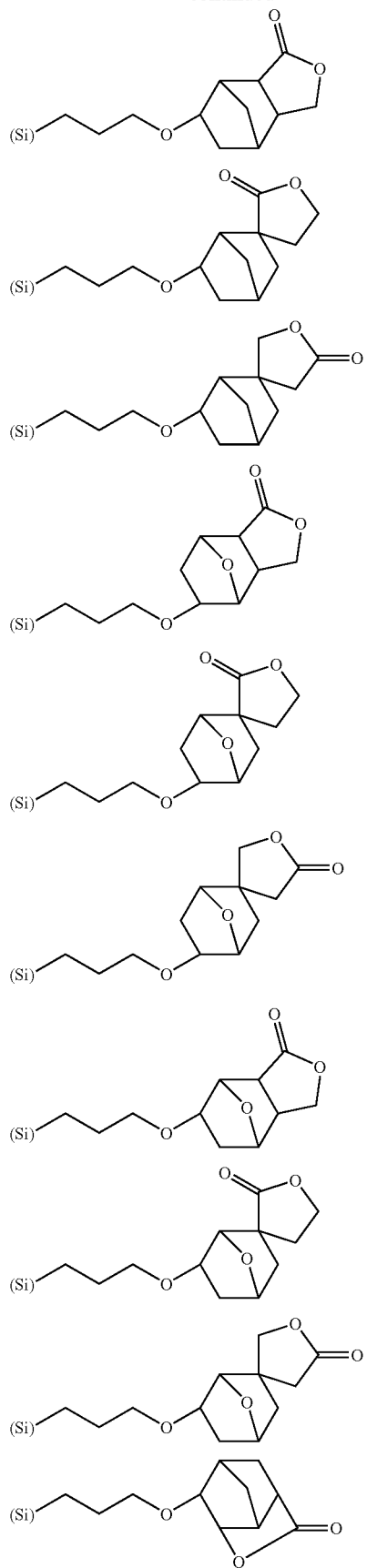
-continued
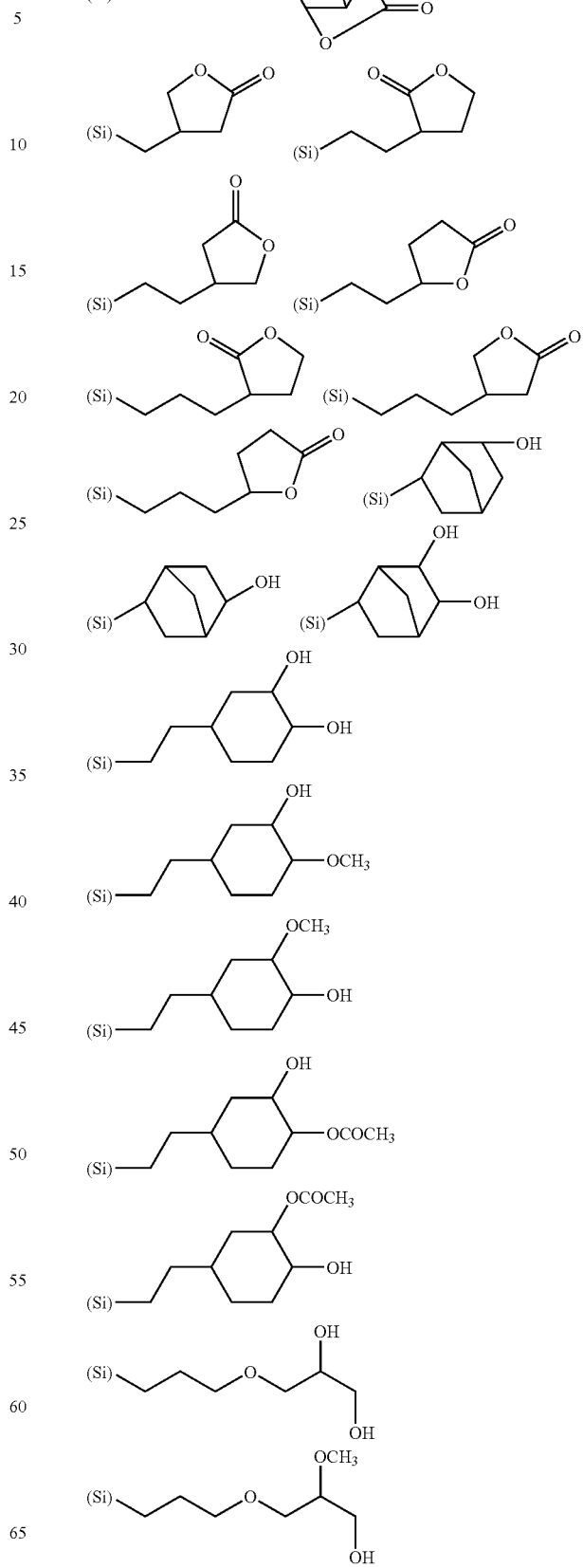

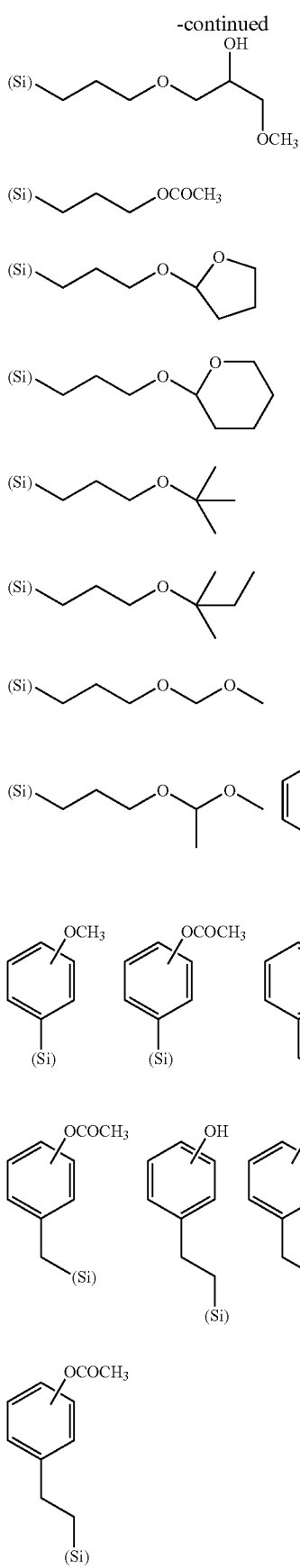
Further, usable examples of organic groups represented by $R^1$, $R^2$, and $R^3$ include organic groups including silicon-silicon bonds. Concrete examples include the following.
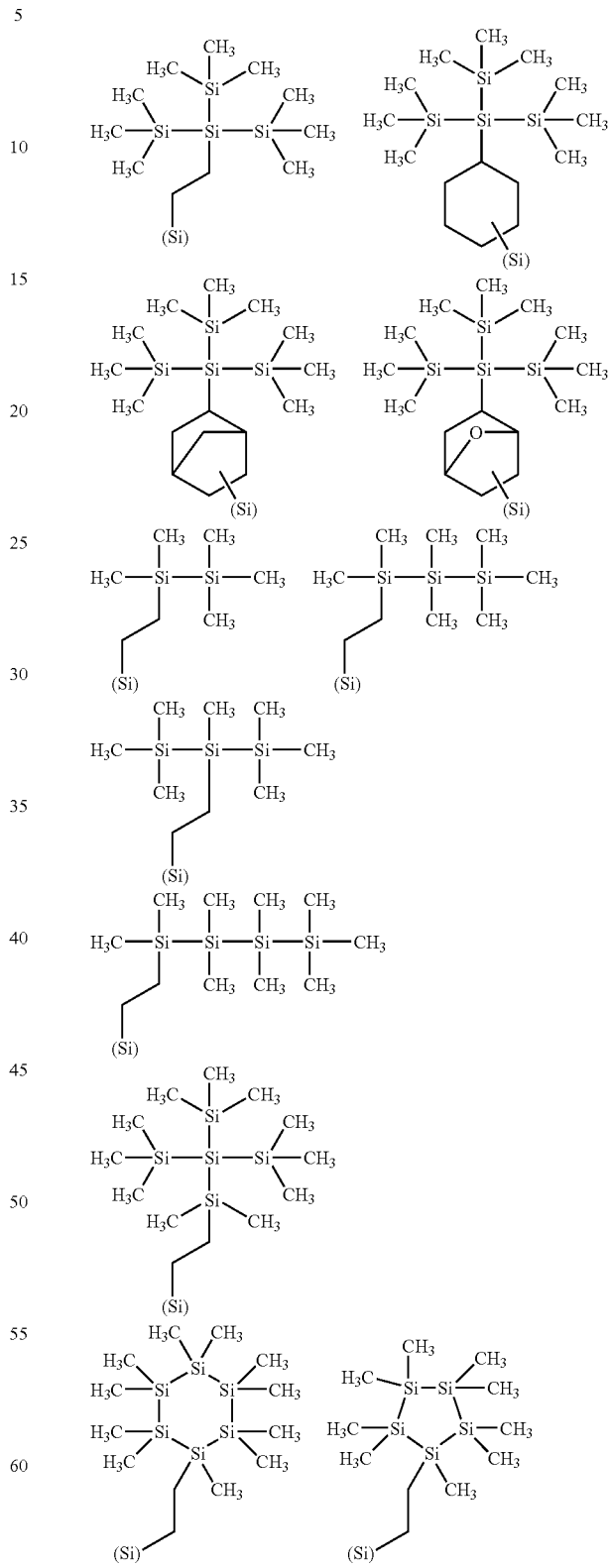
It is possible to select one kind or two or more kinds of monomers represented by the above general formula (1), and to mix them before or during the reaction, to prepare a reaction starting material for forming a silicon-containing compound.

The silicon-containing film composition can be also obtained by hydrolyzing and condensing the hydrolyzable metal compound represented by the following general formula (3) with the silicon-containing monomer at the same time:

  (3)

wherein $R^4$ and $R^5$ are an organic group having 1 to 30 carbon atoms;

m4+m5 is a valence to be determined by a kind of U;

m4 and m5 are an integer of 0 or more; and

U is an element belonging to group III, group IV or group V in the periodic table, except for silicon and carbon.

Herein, the term "organic group" means a group, which includes carbon, and which may additionally include hydrogen, as well as nitrogen, oxygen, sulfur, silicon or the like. Examples of $R^4$ and $R^5$ include: unsubstituted monovalent hydrocarbon groups, such as linear, branched or cyclic alkyl, alkenyl, alkynyl, aryl and aralkyl groups; substituted groups, which one or more hydrogen atoms of the above groups is substituted with an epoxy group, alkoxy group, hydroxy group, or the like; and groups including intramolecular intervening groups such as —O—, —CO—, —COO—, or —OCOO—.

When U is boron, examples of the compounds represented by the formula (3) include, as monomers, boron methoxide, boron ethoxide, boron propoxide, boron butoxide, boron amyloxide, boron hexyloxide, boron cyclopentoxide, boron cyclohexyloxide, boron allyloxide, boron phenoxide, and boron methoxyethoxide.

When U is aluminum, examples of the compounds represented by the formula (3) include, as monomers, aluminum methoxide, aluminum ethoxide, aluminum propoxide, aluminum butoxide, aluminum amyloxide, aluminum hexyloxide, aluminum cyclopentoxide, aluminum cyclohexyloxide, aluminum allyloxide, aluminum phenoxide, aluminum methoxyethoxide, aluminum ethoxyethoxide, aluminum dipropoxyethyl-acetoacetate, aluminum dibutoxyethyl-acetoacetate, aluminum propoxy-bis-ethyl-acetoacetate, aluminum butoxy-bis-ethyl-acetoacetate, aluminum 2,4-pentanedionate, and aluminum 2,2,6,6-tetramethyl-3,5-heptanedionate.

When U is gallium, examples of the compounds represented by the formula (3) include, as monomers, gallium methoxide, gallium ethoxide, gallium propoxide, gallium butoxide, gallium amyloxide, gallium hexyloxide, gallium cyclopentoxide, gallium cyclohexyloxide, gallium allyloxide, gallium phenoxide, gallium methoxyethoxide, gallium ethoxyethoxide, gallium dipropoxyethyl-acetoacetate, gallium dibutoxyethyl-acetoacetate, gallium propoxy-bis-ethyl-acetoacetate, gallium butoxy-bis-ethyl-acetoacetate, gallium 2,4-pentanedionate, and gallium 2,2,6,6-tetramethyl-3,5-heptanedionate.

When U is yttrium, examples of the compounds represented by the formula (3) include, as monomers, yttrium methoxide, yttrium ethoxide, yttrium propoxide, yttrium butoxide, yttrium amyloxide, yttrium hexyloxide, yttrium cyclopentoxide, yttrium cyclohexyloxide, yttrium allyloxide, yttrium phenoxide, yttrium methoxyethoxide, yttrium ethoxyethoxide, yttrium dipropoxyethyl-acetoacetate, yttrium dibutoxyethyl-acetoacetate, yttrium propoxy-bis-ethyl-acetoacetate, yttrium butoxy-bis-ethyl-acetoacetate, yttrium 2,4-pentanedionate, and yttrium 2,2,6,6-tetramethyl-3,5-heptanedionate.

When U is germanium, examples of the compounds represented by the formula (3) include, as monomers, germanium methoxide, germanium ethoxide, germanium propoxide, germanium butoxide, germanium amyloxide, germanium hexyloxide, germanium cyclopentoxide, germanium cyclohexyloxide, germanium allyloxide, germanium phenoxide, germanium methoxyethoxide, and germanium ethoxyethoxide.

When U is titanium, examples of the compounds represented by the formula (3) include, as monomers, titanium methoxide, titanium ethoxide, titanium propoxide, titanium butoxide, titanium amyloxide, titanium hexyloxide, titanium cyclopentoxide, titanium cyclohexyloxide, titanium allyloxide, titanium phenoxide, titanium methoxyethoxide, titanium ethoxyethoxide, titanium dipropoxy-bisethyl-acetoacetate, titanium dibutoxy-bisethyl-acetoacetate, titanium dipropoxy-bis-2,4-pentanedionate, and titanium dibutoxy-bis-2,4-pentanedionate.

When U is hafnium, examples of the compounds represented by the formula (3) include, as monomers, hafnium methoxide, hafnium ethoxide, hafnium propoxide, hafnium butoxide, hafnium amyloxide, hafnium hexyloxide, hafnium cyclopentoxide, hafnium cyclohexyloxide, hafnium allyloxide, hafnium phenoxide, hafnium methoxyethoxide, hafnium ethoxyethoxide, hafnium dipropoxy-bisethyl-acetoacetate, hafnium dibutoxy-bisethyl-acetoacetate, hafnium dipropoxy-bis-2,4-pentanedionate, and hafnium dibutoxy-bis-2,4-pentanedionate.

When U is tin, examples of the compounds represented by the formula (3) include, as monomers, methoxy tin, ethoxy tin, propoxy tin, butoxy tin, phenoxy tin, methoxyethoxy tin, ethoxyethoxy tin, tin 2,4-pentanedionate, and tin 2,2,6,6-tetramethyl-3,5-heptanedionate.

When U is arsenic, examples of the compounds represented by the formula (3) include, as monomers, methoxy arsenic, ethoxy arsenic, propoxy arsenic, butoxy arsenic, and phenoxy arsenic.

When U is antimony, examples of the compounds represented by the formula (3) include, as monomers, methoxy antimony, ethoxy antimony, propoxy antimony, butoxy antimony, phenoxy antimony, antimony acetate, and antimony propionate.

When U is niobium, examples of the compounds represented by the formula (3) include, as monomers, methoxy niobium, ethoxy niobium, propoxy niobium, butoxy niobium, and phenoxy niobium.

When U is tantalum, examples of the compounds represented by the formula (3) include, as monomers, methoxy tantalum, ethoxy tantalum, propoxy tantalum, butoxy tantalum, and phenoxy tantalum.

When U is bismuth, examples of the compounds represented by the formula (3) include, as monomers, methoxy bismuth, ethoxy bismuth, propoxy bismuth, butoxy bismuth, and phenoxy bismuth.

When U is phosphorus, examples of the compounds represented by the formula (3) include, as monomers, trimethyl phosphite, triethyl phosphite, tripropyl phosphite, trimethyl phosphate, triethyl phosphate, and tripropyl phosphate.

When U is vanadium, examples of the compounds represented by the formula (3) include, as monomers, vanadium oxide-bis(2,4-pentanedionate), vanadium 2,4-pentanedionate, vanadium tributoxide oxide, and vanadium tripropoxide oxide.

When U is zirconium, examples of the compounds represented by the formula (3) include, as monomers, methoxy zirconium, ethoxy zirconium, propoxy zirconium, butoxy zirconium, phenoxy zirconium, zirconium dibutoxide-bis(2,4- pentanedionate), and zirconium dipropoxide-bis(2,2,6,6-tetramethyl-3,5-heptanedionate).

It is possible to select one kind or two or more kinds of monomers represented by the above general formula (1), or one kind or two or more kinds of monomers represented by the above general formula (1) and one kind or two or more kinds of monomers represented by the above general formula (3), and to mix them before or during the reaction, to prepare a reaction material for forming a silicon-containing compound.

The silicon-containing compound can be produced by conducting hydrolytic condensation between monomers represented by the general formula (1) and monomers represented by the general formula (3), while adopting, as an acid catalyst, one or more kinds of compounds preferably selected from inorganic acids, aliphatic sulfonic acids, and aromatic sulfonic acids.

Examples of the acid catalyst to be used at this time include hydrofluoric acid, hydrochloric acid, hydrobromic acid, sulfuric acid, nitric acid, perchloric acid, phosphoric acid, methanesulfonic acid, benzenesulfonic acid, and toluenesulfonic acid. The catalyst is used in an amount of $10^{-6}$ to 10 moles, preferably $10^{-5}$ to 5 moles, more preferably $10^{-4}$ to 1 mole, relative to 1 mole of monomers.

The amount of water upon obtainment of the silicon-containing compound from these monomers by hydrolytic condensation, is 0.01 to 100 moles, preferably 0.05 to 50 moles, and more preferably 0.1 to 30 moles, per mole of hydrolyzable substitutional groups bonded to the monomers. Addition amounts exceeding 100 moles are uneconomical, due to merely large-sized apparatuses to be used for reactions.

As a manipulation manner, the monomers are added into an aqueous catalyst solution, to cause initiation of a hydrolytic condensation reaction. At this time, the organic solvent may be added into the aqueous catalyst solution, or monomers may have been diluted with the organic solvent, or both procedures may be performed. The reaction temperature is to be 0 to 100° C., preferably 5 to 80° C. It is a preferable manner to keep the temperature at 5 to 80° C. upon dropping of the monomers, and subsequently mature them at 20 to 80° C.

Examples of organic solvents, which can be added into the aqueous catalyst solution or which can dilute the monomers, include methanol, ethanol, 1-propanol, 2-propanol, 1-butanol, 2-butanol, 2-methyl-1-propanol, acetone, acetonitrile, tetrahydrofuran, toluene, hexane, ethyl acetate, cyclohexanone, methyl-2-n-amylketone, butane diol monomethyl ether, propylene glycol monomethyl ether, ethylene glycol monomethyl ether, butane diol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, and mixtures of them.

Water-soluble ones are preferable among them. Examples thereof include: alcohols such as methanol, ethanol, 1-propanol, and 2-propanol; polyvalent alcohols such as ethylene glycol and propylene glycol; polyvalent alcohol condensation derivatives such as butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, and ethylene glycol monopropyl ether; acetone; acetonitrile; and tetrahydrofuran. Those having boiling points of 100° C. or lower are preferable among them.

Note that the usage amount of the organic solvent is preferably to be 0 to 1,000 ml, particularly preferably 0 to 500 ml, relative to 1 mole of monomers. Excessive usage amounts of the organic solvent uneconomically lead to excessively large reaction vessels.

Thereafter, neutralization reaction of the catalyst is conducted if necessary, and the alcohol produced by the hydrolytic condensation reaction is removed under reduced pressure, thereby obtaining an aqueous solution of reaction product mixture. At this time, the amount of an alkaline substance usable for neutralization is preferably 0.1 to 2 equivalents relative to the acid used as the catalyst. This alkaline substance is arbitrary, insofar as the same exhibits alkalinity in water.

Subsequently, it is preferable to remove by-products such as alcohols produced by the hydrolytic condensation reaction, from the reaction product mixture. Although the temperature for heating the reaction product mixture at this time depends on the kinds of the added organic solvent and alcohols produced by the reaction, the temperature is preferably 0 to 100° C., more preferably 10 to 90° C., and even more preferably 15 to 80° C. Further, although the reduced pressure varies depending on the types of organic solvent and alcohol to be removed, types of evacuating apparatus and condensation apparatus, and the heating temperature, the reduced pressure is preferably at the atmospheric pressure or lower, more preferably 80 kPa or lower in absolute pressure, and even more preferably 50 kPa or lower in absolute pressure. Although it is difficult at this time to accurately determine amounts of alcohols to be removed, it is desirable to remove 80 mass % or more of produced alcohols and the like.

Subsequently, it is preferable to remove the acid catalyst used in the hydrolytic condensation reaction from the reaction product mixture. As a procedure for removing the acid catalyst, the silicon-containing compound is mixed with water, and the silicon-containing compound is extracted with an organic solvent. Suitable as an organic solvent to be used this time, is one which allows for dissolution of the silicon-containing compound therein and which is separated in a two-layered manner from water upon mixing therewith. Examples thereof include methanol, ethanol, 1-propanol, 2-propanol, 1-butanol, 2-butanol, 2-methyl-1-propanol, acetone, tetrahydrofuran, toluene, hexane, ethyl acetate, cyclohexanone, methyl-2-n-amylketone, butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, methyl isobutyl ketone, cyclopentyl methyl ether, and mixtures thereof.

It is also possible to use a mixture of a water-soluble organic solvent and a water hardly-soluble organic solvent. Examples of preferable mixtures include, without limited thereto, combinations of methanol+ethyl acetate, ethanol+ethyl acetate, 1-propanol+ethyl acetate, 2-propanol+ethyl acetate, butane diol monomethyl ether+ethyl acetate, propylene glycol monomethyl ether+ethyl acetate, ethylene glycol monomethyl ether+ethyl acetate, butane diol monoethyl ether+ethyl acetate, propylene glycol monoethyl ether+ethyl acetate, ethylene glycol monoethyl ether+ethyl acetate, butane diol monopropyl ether+ethyl acetate, propylene glycol monopropyl ether+ethyl acetate, ethylene glycol monopropyl ether+ethyl acetate, methanol+methyl isobutyl ketone, ethanol+methyl isobutyl ketone, 1-propanol+methyl isobutyl ketone, 2-propanol+methyl isobutyl ketone, propylene glycol monomethyl ether+methyl isobutyl ketone, ethylene glycol monomethyl ether+methyl isobutyl ketone, propylene glycol monoethyl ether+methyl isobutyl ketone, ethylene glycol monoethyl ether+methyl isobutyl ketone, propylene glycol monopropyl ether+methyl isobutyl ketone, ethylene glycol monopropyl ether+methyl isobutyl ketone, methanol+cyclopentyl methyl ether, ethanol+cyclopentyl methyl ether, 1-propanol+cyclopentyl methyl ether, 2-propanol+cyclopentyl methyl ether, propylene glycol monomethyl ether+cyclopentyl methyl ether, ethylene glycol monomethyl ether+cyclopentyl methyl ether, propylene glycol monoethyl ether+cyclopentyl methyl ether, ethylene glycol monoethyl ether+cyclopentyl methyl ether, propylene glycol monopropyl ether+cyclopentyl methyl ether, ethylene glycol monopropyl ether+cyclopentyl methyl ether, methanol+propylene glycol methyl ether acetate, ethanol+propylene glycol methyl ether acetate, 1-propanol+propylene glycol methyl ether acetate, 2-propanol+propylene glycol methyl ether acetate, propylene glycol monomethyl ether+ propylene glycol methyl ether acetate, ethylene glycol monomethyl ether+propylene glycol methyl ether acetate, propylene glycol monoethyl ether+propylene glycol methyl ether acetate, ethylene glycol monoethyl ether+propylene glycol methyl ether acetate, propylene glycol monopropyl ether+propylene glycol methyl ether acetate, and ethylene glycol monopropyl ether+propylene glycol methyl ether acetate.

Note that although the mixing ratio of the water-soluble organic solvent and the water hardly-soluble organic solvent is to be appropriately selected, the water-soluble organic solvent is selected to be 0.1 to 1,000 parts by mass, preferably 1 to 500 parts by mass, more preferably 2 to 100 parts by mass, relative to 100 parts by mass of the water-hardly soluble organic solvent.

The procedure is followed by washing by neutral water. Usable as such water is so-called deionized water or ultrapure water. The amount of such water is to be 0.01 to 100 L, preferably 0.05 to 50 L, and more preferably 0.1 to 5 L, relative to 1 L of the silicon-containing compound solution. The washing procedure may be conducted by introducing both liquids into one vessel, stirring them, and then leaving them to stand still, followed by separation of a water layer. It is enough for the number of washing steps to be one or more, preferably one to about five, because commensurate effects are not obtained even by washing of ten or more times.

Other examples of methods for removing the acid catalyst include a method based on anion-exchange resin, and a method for conducting neutralization by epoxy compounds such as ethylene oxide and propylene oxide followed by removal. These methods can be appropriately selected in conformity to the acid catalyst for the reaction.

The phrase that the acid catalyst has been substantially removed in the above catalyst removal operation, means that the acid catalyst used for the reaction is allowed to be left in an amount of about 10 mass % or less, preferably 5 mass % or less, relative to the amount added at the initiation of reaction in the silicon-containing compound.

Since a part of the silicon-containing compound is sometimes migrated into a water layer by the washing operation at this time to provide an effect substantially equivalent to a fractionation, the number of washing times and the amount of washing water may be appropriately selected in view of the catalyst removal effect and fractionation effect.

In both cases of a silicon-containing compound including the acid catalyst left therein and a silicon-containing compound solution from which the acid catalyst has been removed, a final solvent is added thereto, and solvent exchange is conducted under reduced pressure, to obtain a resultant silicon-containing compound solution. Although the temperature for solvent exchange depends on the types of reaction solvent, extraction solvent and the like to be removed, the temperature is preferably 0 to 100° C., more preferably 10 to 90° C., and even more preferably 15 to 80° C. Further, the reduced pressure varies depending on the type of extraction solvent to be removed, types of evacuating apparatus and condensation apparatus, and the heating temperature, the reduced pressure is preferably at the atmospheric pressure or lower, more preferably 80 kPa or lower in absolute pressure, and even more preferably 50 kPa or lower in absolute pressure.

At this time, the silicon-containing compound is sometimes made unstable, due to exchange of solvents. This phenomenon is caused depending on the compatibility between the final solvent and the silicon-containing compound, and it is possible to add an organic acid as a stabilizer, so as to prevent the phenomenon. The amount to be added is 0 to 25 parts by mass, preferably 0 to 15 parts by mass, and more preferably 0 to 5 parts by mass relative to 100 parts by mass of the silicon-containing compound in the solution before solvent exchange, and 0.5 or more parts by mass are preferable in case of addition. If necessary, it is possible to add the stabilizer to the solution before solvent exchange and to subsequently conduct a solvent exchange operation.

When the silicon-containing compound is concentrated to a certain concentration or denser, condensation reaction is progressed, so that the compound is changed into a state incapable of being re-dissolved in an organic solvent. As such, the compound is to be preferably kept in a solution state at an appropriate concentration. Thus, the suitable concentration in this case is preferably 50 mass % or less, more preferably 40 mass % or less, even more preferably 30 mass %.

Suitable as a final solvent to be added to the silicon-containing compound solution is an alcohol-based solvent, and particularly desirable examples thereof include monoalkyl ether derivatives of: ethylene glycol, diethylene glycol, triethylene glycol, propylene glycol, dipropylene glycol, and butanediol. Preferable examples concretely include butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, and ethylene glycol monopropyl ether.

As another operation for reaction, water or water-containing organic solvent is added to the monomers or an organic solution of monomers, to initiate a hydrolysis reaction. At this time, the catalyst may be added to the monomers or the organic solution of monomers, or may have been added into water or the water-containing organic solvent. The reaction temperature is to be 0 to 100° C., preferably 10 to 80° C. It is a preferable procedure to conduct heating to 10 to 50° C. upon dropping of water, and to subsequently raise the temperature to 20 to 80° C. for maturation.

In case of using organic solvents, water-soluble ones are preferable, and examples thereof include methanol, ethanol, 1-propanol, 2-propanol, 1-butanol, 2-butanol, 2-methyl-1-propanol, acetone, tetrahydrofuran, acetonitrile; and polyvalent alcohol condensate derivatives such as: butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether; and mixtures thereof.

The usage amount of the organic solvent may be the same as the above. The obtained reaction product mixture is post-treated in the same manner as the above, to obtain a silicon-containing compound.

Although the molecular weight of the obtained silicon-containing compound can be adjusted not only by selection of monomers but also by control of reaction condition upon polymerization, adoption of compounds having weight-average molecular weights exceeding 100,000 occasionally cause occurrence of extraneous substances or coating patch, so that those compounds are to be preferably used which have weight-average molecular weights of 100,000 or less, preferably 200 to 50,000, and more preferably 300 to 30,000, respectively. Note that the data concerning the weight-average molecular weight is obtained as a molecular weight determined by gel permeation chromatography (GPC) using an RI detector and polystyrene standards.

The composition for forming the silicon-containing film which is capable of being stripped to remove by the present invention is allowed to contain two or more kinds of silicon-containing compounds which are mutually different in composition and/or reaction condition, insofar as produced under acidic conditions, respectively.

The silicon-containing film-forming composition which is capable of being removed by the process of the present invention can be prepared by further blending the thermal crosslinking accelerator, organic acid as a stabilizer, a crosslinking agent, and an organic solvent into the above mentioned silicon-containing compound.

In this way, a thermal crosslinking accelerator may be contained in the composition for forming the silicon-containing film which is capable of being removed by the process of the present invention, so as to further promote a cross-linking reaction upon formation of the silicon-containing film. Examples of such a thermal crosslinking accelerator include compounds represented by the general formula (4) or (5):

$$L_a H_b X \quad (4)$$

wherein L is lithium, sodium, potassium, rubidium, or cesium;

X is a hydroxyl group, or a monovalent, divalent or higher organic acid group having 1 to 30 carbon atoms;

a is an integer of 1 or more;

b is an integer of 0 or 1 or more; and a+b is a valence of the hydroxyl group or organic acid group $$M_a H_b A \quad (5)$$

wherein M is sulfonium, iodonium, or ammonium, preferably tertiary sulfonium, secondary iodonium or quaternary ammonium, more preferably photo-degradable compound such as triphenylsulfonium compound, diphenyliodonium compound;

A is the same as the above X or a non-nucleophilic counter ion;

a and b are the same as the above respectively; and a+b is a valence of the hydroxyl group, organic acid group, or non-nucleophilic counter ion.

Examples of the compound represented by the general formula (4) include alkali metal salts of organic acids. Examples include salts of lithium, sodium, potassium, rubidium and cesium with monovalent acids such as hydroxide, formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, and trichloroacetic acid; and salts of lithium, sodium, potassium, rubidium and cesium with monovalent or divalent acids such as oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid, citric acid, and carbonic acid.

Concrete examples include lithium formate, lithium acetate, lithium propionate, lithium butanoate, lithium pentanoate, lithium hexanoate, lithium heptanoate, lithium octanoate, lithium nonanoate, lithium decanoate, lithium oleate, lithium stearate, lithium linoleate, lithium linolenate, lithium benzoate, lithium phthalate, lithium isophthalate, lithium terephthalate, lithium salicylate, lithium trifluoroacetate, lithium monochloroacetate, lithium dichloroacetate, lithium trichloroacetate, lithium hydroxide, lithium hydrogen oxalate, lithium hydrogen malonate, lithium hydrogen methylmalonate, lithium hydrogen ethylmalonate, lithium hydrogen propylmalonate, lithium hydrogen butylmalonate, lithium hydrogen dimethylmalonate, lithium hydrogen diethylmalonate, lithium hydrogen succinate, lithium hydrogen methylsuccinate, lithium hydrogen glutarate, lithium hydrogen adipate, lithium hydrogen itaconate, lithium hydrogen maleate, lithium hydrogen fumarate, lithium hydrogen citraconate, lithium hydrogen citrate, lithium hydrogen carbonate, lithium oxalate, lithium malonate, lithium methylmalonate, lithium ethylmalonate, lithium propylmalonate, lithium butylmalonate, lithium dimethylmalonate, lithium diethylmalonate, lithium succinate, lithium methylsuccinate, lithium glutarate, lithium adipate, lithium itaconate, lithium maleate, lithium fumarate, lithium citraconate, lithium citrate; and lithium carbonate;

sodium formate, sodium acetate, sodium propionate, sodium butanoate, sodium pentanoate, sodium hexanoate, sodium heptanoate, sodium octanoate, sodium nonanoate, sodium decanoate, sodium oleate, sodium stearate, sodium linoleate, sodium linolenate, sodium benzoate, sodium phthalate, sodium isophthalate, sodium terephthalate, sodium salicylate, sodium trifluoroacetate, sodium monochloroacetate, sodium dichloroacetate, sodium trichloroacetate, sodium hydroxide, sodium hydrogen oxalate, sodium hydrogen malonate, sodium hydrogen methylmalonate, sodium hydrogen ethylmalonate, sodium hydrogen propylmalonate, sodium hydrogen butylmalonate, sodium hydrogen dimethylmalonate, sodium hydrogen diethylmalonate, sodium hydrogen succinate, sodium hydrogen methylsuccinate, sodium hydrogen glutarate, sodium hydrogen adipate, sodium hydrogen itaconate, sodium hydrogen maleate, sodium hydrogen fumarate, sodium hydrogen citraconate, sodium hydrogen citrate, sodium hydrogen carbonate, sodium oxalate, sodium malonate, sodium methylmalonate, sodium ethylmalonate, sodium propylmalonate, sodium butylmalonate, sodium dimethylmalonate, sodium diethylmalonate, sodium succinate, sodium methylsuccinate, sodium glutarate, sodium adipate, sodium itaconate, sodium maleate, sodium fumarate, sodium citraconate, sodium citrate, and sodium carbonate; and potassium formate, potassium acetate, potassium propionate, potassium butanoate, potassium pentanoate, potassium hexanoate, potassium heptanoate, potassium octanoate, potassium nonanoate, potassium decanoate, potassium oleate, potassium stearate, potassium linoleate, potassium linolenate, potassium benzoate, potassium phthalate, potassium isophthalate, potassium terephthalate, potassium salicylate, potassium trifluoroacetate, potassium monochloroacetate, potassium dichloroacetate, potassium trichloroacetate, potassium hydroxide, potassium hydrogen oxalate, potassium hydrogen malonate, potassium hydrogen methylmalonate, potassium hydrogen ethylmalonate, potassium hydrogen propylmalonate, potassium hydrogen butylmalonate, potassium hydrogen dimethylmalonate, potassium hydrogen diethylmalonate, potassium hydrogen succinate, potassium hydrogen methylsuccinate, potassium hydrogen glutarate, potassium hydrogen adipate, potassium hydrogen itaconate, potassium hydrogen maleate, potassium hydrogen fumarate, potassium hydrogen citraconate, potassium hydrogen citrate, potassium hydrogen carbonate, potassium oxalate, potassium malonate, potassium methylmalonate, potassium ethylmalonate, potassium propylmalonate, potassium butylmalonate, potassium dimethylmalonate, potassium diethylmalonate, potassium succinate, potassium methylsuccinate, potassium glutarate, potassium adipate, potassium itaconate, potassium maleate, potassium fumarate, potassium citraconate, potassium citrate, and potassium carbonate.

Examples of the compound represented by the general formula (5) include sulfonium compounds, iodonium compounds, and ammonium compounds represented by formulae (Q-1), (Q-2), and (Q-3), respectively:

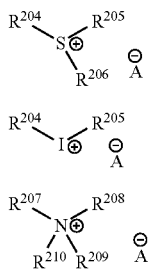

wherein $R^{204}$, $R^{205}$, $R^{206}$ each represent a linear, branched, or cyclic alkyl, alkenyl, oxoalkyl, or oxoalkenyl group having 1 to 12 carbon atoms, a substituted or unsubstituted aryl group having 6 to 20 carbon atoms, or an aralkyl or aryloxoalkyl group having 7 to 12 carbon atoms, wherein some or all hydrogen atoms of these groups may be substituted by alkoxy groups or the like, and wherein $R^{205}$ and $R^{206}$ may form a ring together, and when a ring is formed, $R^{205}$ and $R^{206}$ each represent an alkylene group having 1 to 6 carbon atoms;

$A^-$ represents a non-nucleophilic counter ion; and $R^{207}$, $R^{208}$, $R^{209}$, and $R^{210}$ are the same as $R^{204}$, $R^{205}$, and $R^{206}$, and may be a hydrogen atom;

wherein $R^{207}$ and $R^{208}$, or $R^{207}$, $R^{208}$ and $R^{209}$ may form a ring together, and when a ring is formed, $R^{207}$ and $R^{208}$, or $R^{207}$, $R^{208}$ and $R^{209}$ represent an alkylene group having 3 to 10 carbon atoms.

$R^{204}$, $R^{205}$, $R^{206}$, $R^{207}$, $R^{208}$, $R^{209}$, and $R^{210}$ may be the same or different from one another, and concrete examples of alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl groups. Examples of alkenyl groups include vinyl, allyl, propenyl, butenyl, hexenyl, and cyclohexenyl groups. Examples of oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl groups. Examples of aryl groups include phenyl and naphthyl groups; alkoxyphenyl groups such as p-methoxyphenyl, m-methoxyphenyl, o-methoxyphenyl, ethoxyphenyl, p-tert-butoxyphenyl, and m-tert-butoxyphenyl groups; alkylphenyl groups such as 2-methylphenyl, 3-methylphenyl, 4-methylphenyl, ethylphenyl, 4-tert-butylphenyl, 4-butylphenyl, and dimethylphenyl groups; alkylnaphthyl groups such as methylnaphthyl and ethylnaphthyl groups; alkoxynaphthyl groups such as methoxynaphthyl and ethoxynaphthyl groups; dialkylnaphthyl groups such as dimethylnaphthyl and diethylnaphthyl groups; and dialkoxynaphthyl groups such as dimethoxynaphthyl and diethoxynaphthyl groups. Examples of aralkyl groups include benzyl, phenylethyl, and phenethyl groups. Examples of aryloxoalkyl groups include 2-aryl-2-oxoethyl groups such as 2-phenyl-2-oxoethyl, 2-(1-naphthyl)-2-oxoethyl, and 2-(2-naphthyl)-2-oxoethyl groups.

Examples of $A^-$ include hydroxyl ion, formate ion, acetate ion, propionate ion, butanoate ion, pentanoate ion, hexanoate ion, heptanoate ion, octanoate ion, nonanoate ion, decanoate ion, oleate ion, stearate ion, linoleate ion, linolenate ion, benzoate ion, p-methylbenzoate ion, p-t-butylbenzoate ion, phthalate ion, isophthalate ion, terephthalate ion, salicylate ion, trifluoroacetate ion, monochloroacetate ion, dichloroacetate ion, trichloroacetate ion, fluoride ion, chloride ion, bromide ion, iodide ion, nitrate ion, chlorate ion, perchlorate ion, bromate ion, iodate ion, oxalate ion, malonate ion, methylmalonate ion, ethylmalonate ion, propylmalonate ion, butylmalonate ion, dimethylmalonate ion, diethylmalonate ion, succinate ion, methylsuccinate ion, glutarate ion, adipate ion, itaconate ion, maleate ion, fumarate ion, citraconate ion, citrate ion, and carbonate ion.

Concrete examples of sulfonium compounds include triphenylsulfonium formate, triphenylsulfonium acetate, triphenylsulfonium propionate, triphenylsulfonium butanoate, triphenylsulfonium pentanoate, triphenylsulfonium hexanoate, triphenylsulfonium heptanoate, triphenylsulfonium octanoate, triphenylsulfonium nonanoate, triphenylsulfonium decanoate, triphenylsulfonium oleate, triphenylsulfonium stearate, triphenylsulfonium linoleate, triphenylsulfonium linolenate, triphenylsulfonium benzoate, triphenylsulfonium p-methylbenzoate, triphenylsulfonium p-t-butylbenzoate, triphenylsulfonium phthalate, triphenylsulfonium isophthalate, triphenylsulfonium terephthalate, triphenylsulfonium salicylate, triphenylsulfonium trifluoroacetate, triphenylsulfonium monochloroacetate, triphenylsulfonium dichloroacetate, triphenylsulfonium trichloroacetate, triphenylsulfonium hydroxide, triphenylsulfonium oxalate, triphenylsulfonium malonate, triphenylsulfonium methylmalonate, triphenylsulfonium ethylmalonate, triphenylsulfonium propylmalonate, triphenylsulfonium butylmalonate, triphenylsulfonium dimethylmalonate, triphenylsulfonium diethylmalonate, triphenylsulfonium succinate, triphenylsulfonium methylsuccinate, triphenylsulfonium glutarate, triphenylsulfonium adipate, triphenylsulfonium itaconate, triphenylsulfonium maleate, triphenylsulfonium fumarate, triphenylsulfonium citraconate, triphenylsulfonium citrate, triphenylsulfonium carbonate, triphenylsulfonium chloride, triphenylsulfonium bromide, triphenylsulfonium iodide, triphenylsulfonium nitrate, triphenylsulfonium chlorate, triphenylsulfonium perchlorate, triphenylsulfonium bromate, triphenylsulfonium iodate, bistriphenylsulfonium oxalate, bistriphenylsulfonium malonate, bistriphenylsulfonium methylmalonate, bistriphenylsulfonium ethylmalonate, bistriphenylsulfonium propylmalonate, bistriphenylsulfonium butylmalonate, bistriphenylsulfonium dimethylmalonate, bistriphenylsulfonium diethylmalonate, bistriphenylsulfonium succinate, bistriphenylsulfonium methylsuccinate, bistriphenylsulfonium glutarate, bistriphenylsulfonium adipate, bistriphenylsulfonium itaconate, bistriphenylsulfonium maleate, bistriphenylsulfonium fumarate, bistriphenylsulfonium citraconate, bistriphenylsulfonium citrate, and bistriphenylsulfonium carbonate.

Concrete examples of iodonium compounds include diphenyliodonium formate, diphenyliodonium acetate, diphenyliodonium propionate, diphenyliodonium butanoate, diphenyliodonium pentanoate, diphenyliodonium hexanoate, diphenyliodonium heptanoate, diphenyliodonium octanoate, diphenyliodonium nonanoate, diphenyliodonium decanoate, diphenyliodonium oleate, diphenyliodonium stearate, diphenyliodonium linoleate, diphenyliodonium linolenate, diphenyliodonium benzoate, diphenyliodonium p-methylbenzoate, diphenyliodonium p-t-butylbenzoate, diphenyliodonium phthalate, diphenyliodonium isophthalate, diphenyliodonium terephthalate, diphenyliodonium salicylate, diphenyliodonium trifluoroacetate, diphenyliodonium monochloroacetate, diphenyliodonium dichloroacetate, diphenyliodonium trichloroacetate, diphenyliodonium hydroxide, diphenyliodonium oxalate, diphenyliodonium malonate, diphenyliodonium methylmalonate, diphenyliodonium ethylmalonate, diphenyliodonium propylmalonate, diphenyliodonium butylmalonate, diphenyliodonium dimethylmalonate, diphenyliodonium diethylmalonate, diphenyliodonium succinate, diphenyliodonium methylsuccinate, diphenyliodonium glutarate, diphenyliodonium adipate, diphenyliodonium itaconate, diphenyliodonium maleate, diphenyliodonium fumarate, diphenyliodonium citraconate, diphenyliodonium citrate, diphenyliodonium carbonate, diphenyliodonium chloride, diphenyliodonium bromide, diphenyliodonium iodide, diphenyliodonium nitrate, diphenyliodonium chlorate, diphenyliodonium perchlorate, diphenyliodonium bromate, diphenyliodonium iodate, bisdiphenyliodonium oxalate, bisdiphenyliodonium malonate, bisdiphenyliodonium methylmalonate, bisdiphenyliodonium ethylmalonate, bisdiphenyliodonium propylmalonate, bisdiphenyliodonium butylmalonate, bisdiphenyliodonium dimethylmalonate, bisdiphenyliodonium diethylmalonate, bisdiphenyliodonium succinate, bisdiphenyliodonium methylsuccinate, bisdiphenyliodonium glutarate, bisdiphenyliodonium adipate, bisdiphenyliodonium itaconate, bisdiphenyliodonium maleate, bisdiphenyliodonium fumarate, bisdiphenyliodonium citraconate, bisdiphenyliodonium citrate, and bisdiphenyliodonium carbonate.

Concrete examples of ammonium compounds include tetramethylammonium formate, tetramethylammonium acetate, tetramethylammonium propionate, tetramethylammonium butanoate, tetramethylammonium pentanoate, tetramethylammonium hexanoate, tetramethylammonium heptanoate, tetramethylammonium octanoate, tetramethylammonium nonanoate, tetramethylammonium decanoate, tetramethylammonium oleate, tetramethylammonium stearate, tetramethylammonium linoleate, tetramethylammonium linolenate, tetramethylammonium benzoate, tetramethylammonium p-methylbenzoate, tetramethylammonium p-t-butylbenzoate, tetramethylammonium phthalate, tetramethylammonium isophthalate, tetramethylammonium terephthalate, tetramethylammonium salicylate, tetramethylammonium trifluoroacetate, tetramethylammonium monochloroacetate, tetramethylammonium dichloroacetate, tetramethylammonium trichloroacetate, tetramethylammonium hydroxide, tetramethylammonium oxalate, tetramethylammonium malonate, tetramethylammonium methylmalonate, tetramethylammonium ethylmalonate, tetramethylammonium propylmalonate, tetramethylammonium butylmalonate, tetramethylammonium dimethylmalonate, tetramethylammonium diethylmalonate, tetramethylammonium succinate, tetramethylammonium methylsuccinate, tetramethylammonium glutarate, tetramethylammonium adipate, tetramethylammonium itaconate, tetramethylammonium maleate, tetramethylammonium fumarate, tetramethylammonium citraconate, tetramethylammonium citrate, tetramethylammonium carbonate, tetramethylammonium chloride, tetramethylammonium bromide, tetramethylammonium iodide, tetramethylammonium nitrate, tetramethylammonium chlorate, tetramethylammonium perchlorate, tetramethylammonium bromate, tetramethylammonium iodate, bistetramethylammonium oxalate, bistetramethylammonium malonate, bistetramethylammonium methylmalonate, bistetramethylammonium ethylmalonate, bistetramethylammonium propylmalonate, bistetramethylammonium butylmalonate, bistetramethylammonium dimethylmalonate, bistetramethylammonium diethylmalonate, bistetramethylammonium succinate, bistetramethylammonium methylsuccinate, bistetramethylammonium glutarate, bistetramethylammonium adipate, bistetramethylammonium itaconate, bistetramethylammonium maleate, bistetramethylammonium fumarate, bistetramethylammonium citraconate, bistetramethylammonium citrate, bistetramethylammonium carbonate; tetrapropylammonium formate, tetrapropylammonium acetate, tetrapropylammonium propionate, tetrapropylammonium butanoate, tetrapropylammonium pentanoate, tetrapropylammonium hexanoate, tetrapropylammonium heptanoate, tetrapropylammonium octanoate, tetrapropylammonium nonanoate, tetrapropylammonium decanoate, tetrapropylammonium oleate, tetrapropylammonium stearate, tetrapropylammonium linoleate, tetrapropylammonium linolenate, tetrapropylammonium benzoate, tetrapropylammonium p-methylbenzoate, tetrapropylammonium p-t-butylbenzoate, tetrapropylammonium phthalate, tetrapropylammonium isophthalate, tetrapropylammonium terephthalate, tetrapropylammonium salicylate, tetrapropylammonium trifluoroacetate, tetrapropylammonium monochloroacetate, tetrapropylammonium dichloroacetate, tetrapropylammonium trichloroacetate, tetrapropylammonium hydroxide, tetrapropylammonium oxalate, tetrapropylammonium malonate, tetrapropylammonium methylmalonate, tetrapropylammonium ethylmalonate, tetrapropylammonium propylmalonate, tetrapropylammonium butylmalonate, tetrapropylammonium dimethylmalonate, tetrapropylammonium diethylmalonate, tetrapropylammonium succinate, tetrapropylammonium methylsuccinate, tetrapropylammonium glutarate, tetrapropylammonium adipate, tetrapropylammonium itaconate, tetrapropylammonium maleate, tetrapropylammonium fumarate, tetrapropylammonium citraconate, tetrapropylammonium citrate, tetrapropylammonium carbonate, tetrapropylammonium chloride, tetrapropylammonium bromide, tetrapropylammonium iodide, tetrapropylammonium nitrate, tetrapropylammonium chlorate, tetrapropylammonium perchlorate, tetrapropylammonium bromate, tetrapropylammonium iodate, biatetrapropylammonium oxalate, bistetrapropylammonium malonate, bistetrapropylammonium methylmalonate, bistetrapropylammonium ethylmalonate, bistetrapropylammonium propylmalonate, bistetrapropylammonium butylmalonate, bistetrapropylammonium dimethylmalonate, bistetrapropylammonium diethylmalonate, bistetrapropylammonium succinate, bistetrapropylammonium methyl succinate, bistetrapropylammonium glutarate, bistetrapropylammonium adipate, bistetrapropylammonium itaconate, bistetrapropylammonium maleate, bistetrapropylammonium fumarate, bistetrapropylammonium citraconate, bistetrapropylammonium citrate, bistetrapropylammonium carbonate; and tetrabutylammonium formate, tetrabutylammonium acetate, tetrabutylammonium propionate, tetrabutylammonium butanoate, tetrabutylammonium pentanoate, tetrabutylammonium hexanoate, tetrabutylammonium heptanoate, tetrabutylammonium octanoate, tetrabutylammonium nonanoate, tetrabutylammonium decanoate, tetrabutylammonium oleate, tetrabutylammonium stearate, tetrabutylammonium linoleate, tetrabutylammonium linolenate, tetrabutylammonium benzoate, tetrabutylammonium p-methylbenzoate, tetrabutylammonium p-t-butylbenzoate, tetrabutylammonium phthalate, tetrabutylammonium isophthalate, tetrabutylammonium terephthalate, tetrabutylammonium salicylate, tetrabutylammonium trifluoroacetate, tetrabutylammonium monochloroacetate, tetrabutylammonium dichloroacetate, tetrabutylammonium trichloroacetate, tetrabutylammonium hydroxide, tetrabutylammonium oxalate, tetrabutylammonium malonate, tetrabutylammonium methylmalonate, tetrabutylammonium ethylmalonate, tetrabutylammonium propylmalonate, tetrabutylammonium butylmalonate, tetrabutylammonium dimethylmalonate, tetrabutylammonium diethylmalonate, tetrabutylammonium succinate, tetrabutylammonium methylsuccinate, tetrabutylammonium glutarate, tetrabutylammonium adipate, tetrabutylammonium itaconate, tetrabutylammonium maleate, tetrabutylammonium fumarate, tetrabutylammonium citraconate, tetrabutylammonium citrate, tetrabutylammonium carbonate, tetrabutylammonium chloride, tetrabutylammonium bromide, tetrabutylammonium iodide, tetrabutylammonium nitrate, tetrabutylammonium chlorate, tetrabutylammonium perchlorate, tetrabutylammonium bromate, tetrabutylammonium iodate, bistetrabutylammonium oxalate, bistetrabutylammonium malonate, bistetrabutylammonium methylmalonate, bistetrabutylammonium ethylmalonate, bistetrabutylammonium propylmalonate, bistetrabutylammonium butylmalonate, bistetrabutylammonium dimethylmalonate, bistetrabutylammonium diethylmalonate, bistetrabutylammonium succinate, bistetrabutylammonium methylsuccinate, bistetrabutylammonium glutarate, bistetrabutylammonium adipate, bistetrabutylammonium itaconate, bistetrabutylammonium maleate, bistetrabutylammonium fumarate, bistetrabutylammonium citraconate, bistetrabutylammonium citrate, and bistetrabutylammonium carbonate.

Note that the thermal crosslinking accelerators can be used solely in one kind or combinedly in two or more kinds. The addition amount of the thermal crosslinking accelerators is preferably 0.01 to 50 parts by mass, and more preferably 0.1 to 40 parts by mass, relative to 100 parts by mass of the base polymer i.e., the silicon-containing compound obtained by the above procedure).

To ensure stability of the composition for forming the silicon-containing film which is removable by the process of the present invention, it is possible to add a monovalent, divalent, or higher organic acid having 1 to 30 carbon atoms as the stabilizer. Examples of the acid to be added include formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, trichloroacetic acid, oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid, and citric acid, Particularly preferable examples include oxalic acid, maleic acid, formic acid, acetic acid, propionic acid, and citric acid. It is possible to mixingly use two or more kinds of acids, so as to keep the stability. The addition amount is 0.001 to 25 parts by mass, preferably 0.01 to 15 parts by mass, and more preferably 0.1 to 5 parts by mass, relative to 100 parts by mass of the silicon-containing compound in the composition.

Alternatively, the organic acid is preferably blended in a manner to achieve 0≤pH≤7, more preferably 0.3≤pH≤6.5, and even more preferably 0.5≤pH≤6, when evaluated as a pH of the composition.

Further addition of the trivalent or higher alcohol as a crosslinking agent allows for obtainment of a silicon-containing film-forming composition capable of forming a silicon-containing film which is removable more easily. Among such trivalent or higher alcohols, alcohols having two or more primary hydroxyl groups are preferable. Examples thereof include compounds represented by the formulae, respectively:

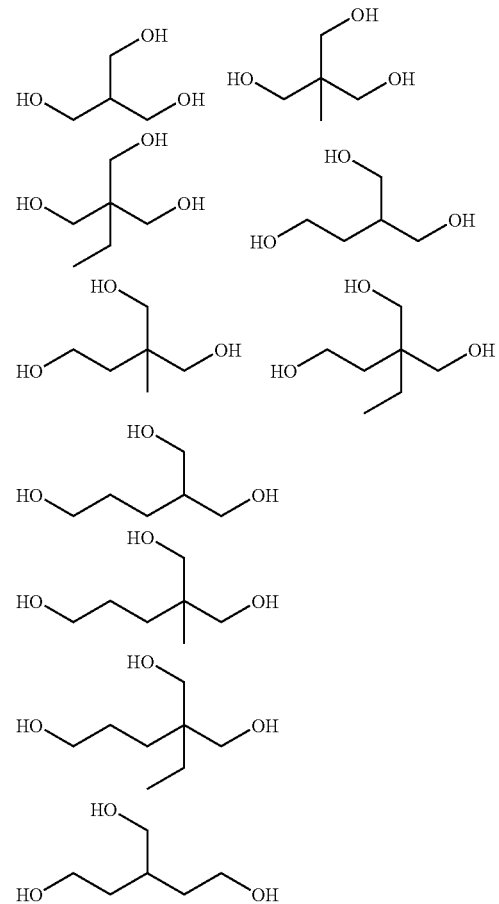

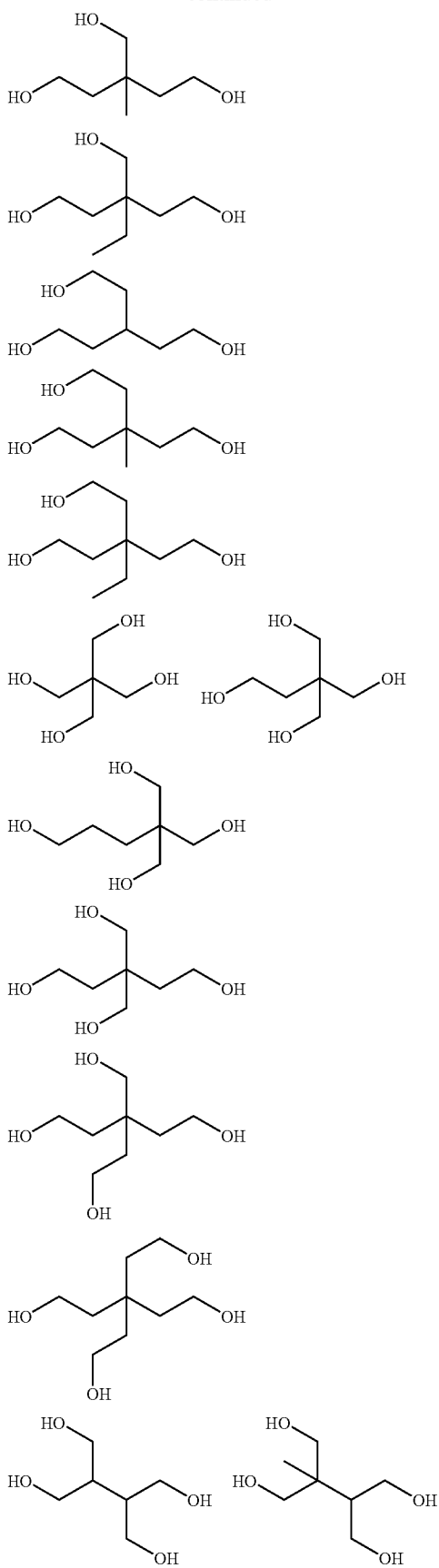
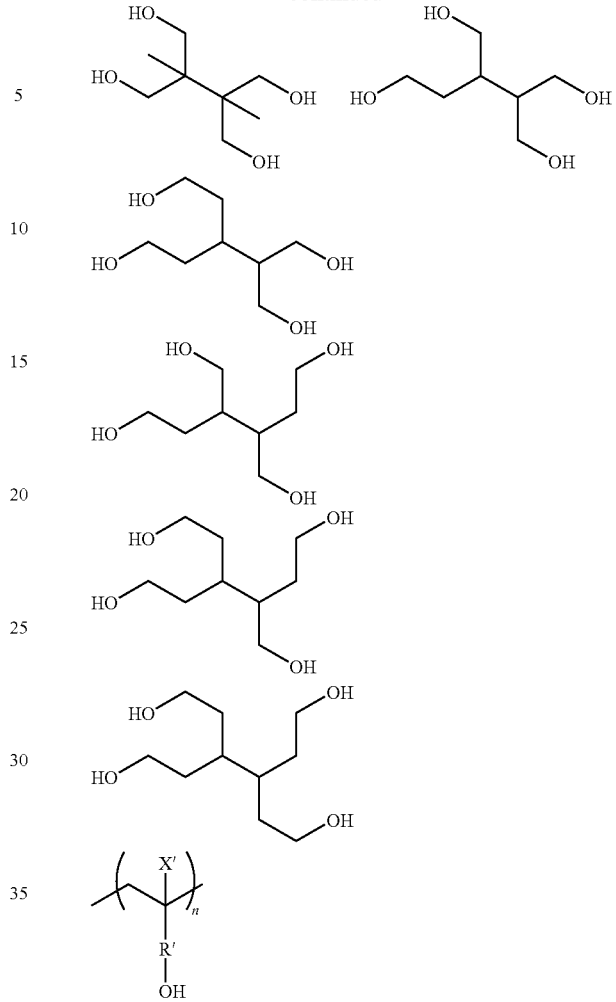

wherein X' is a hydrogen atom or methyl group;

R' is an organic group having 1 or more carbon atoms, where the carbon at the hydroxyl group side is a methylene group; and n is an integer of 3 or more and less than 100.

The above crosslinking agents can be used solely in one kind or combinedly in two or more kinds. The addition amount of the crosslinking agent is preferably 0.001 to 50 parts by mass, more preferably 0.01 to 40 parts by mass relative to 100 parts by mass of base polymer (i.e., the silicon-containing compound obtained by the above procedure).

Addition of such a crosslinking agent causes the once cured film to be decomposed by an effect of a stripper, from the site of crosslinking agent constituted of carbon atoms, to thereby break the silicon-containing film, thereby facilitating stripping thereof.

To be used as a solvent for the composition for forming the silicon-containing film which is capable of being removed by the present invention method, may be the same organic solvent as used upon production of the silicon-containing compound as described above, and preferable examples to be used include water-soluble organic solvents, particularly monoalkyl ether derivatives of ethylene glycol, diethylene glycol, triethylene glycol, propylene glycol, dipropylene glycol, butanediol, and pentanediol. Concretely used are organic solvents selected from among butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, and ethylene glycol monopropyl ether.

It is possible to add water to the composition for forming the silicon-containing film which is removable by the present invention. Addition of water causes the silicon-containing compound to be hydrated, thereby improving lithography performance thereof. The content rate of water in the solvent components of the composition is preferably more than 0 mass % and less than 50 mass %, more preferably 0.3 to 30 mass %, and even more preferably 0.5 to 20 mass %. Excessively large amounts of the respective components result in a deteriorated uniformity of a coated film, and causing eye holes at the worst. Contrary, excessively small amounts disadvantageously deteriorate the lithography performance.

The usage amount of all the solvents including water is preferably 500 to 100,000 parts by mass, and particularly 400 to 50,000 parts by mass, relative to 100 parts by mass of the base polymer.

It is possible to add a photoacid generator to the composition for forming the silicon-containing film which is removable by the present invention. Examples of photoacid generators to be used in the present invention include:

(A-I) onium salts of the following formula (P1a-1), (P1a-2) or (P1b),
(A-II) diazomethane derivatives of the following formula (P2),
(A-III) glyoxime derivatives of the following formula (P3),
(A-IV) bissulfone derivatives of the following formula (P4),
(A-V) sulfonate esters of N-hydroxyimide compounds of the following formula (P5),
(A-VI) β-ketosulfonic acid derivatives,
(A-VII) disulfone derivatives,
(A-VIII) nitrobenzylsulfonate derivatives, and
(A-IX) sulfonic ester derivatives.

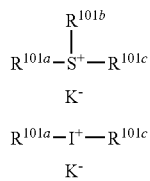

Wherein $R^{101a}$, $R^{101b}$ and $R^{101c}$ are each linear, branched or cyclic alkyl, alkenyl, oxoalkyl or oxoalkenyl groups having 1 to 12 carbon atoms, substituted or unsubstituted aryl groups having 6 to 20 carbon atoms, or aralkyl or aryloxyalkyl groups having 7 to 12 carbon atoms, wherein some or all of hydrogen atoms of these groups may be substituted with alkoxy groups or the like; and wherein $R^{101b}$ and $R^{101c}$ may form a ring together with a sulfur atom to which they bond, and when a ring is formed, $R^{101b}$ and $R^{101c}$ each represent an alkylene group having 1 to 6 carbon atoms; and K⁻ represents a non-nucleophilic counter ion.

$R^{101a}$, $R^{101b}$, and $R^{101c}$ may be the same or different from one another, and concrete examples of alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl groups. Examples of alkenyl groups include vinyl, allyl, propenyl, butenyl, hexenyl, and cyclohexenyl groups. Examples of oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl groups. Examples of aryl groups include phenyl and naphthyl groups; alkoxyphenyl groups such as p-methoxyphenyl, m-methoxyphenyl, o-methoxyphenyl, ethoxyphenyl, p-tert-butoxyphenyl, and m-tert-butoxyphenyl groups; alkylphenyl groups such as 2-methylphenyl, 3-methylphenyl, 4-methylphenyl, ethylphenyl, 4-tert-butylphenyl, 4-butylphenyl, and dimethylphenyl groups; alkylnaphthyl groups such as methylnaphthyl and ethylnaphthyl groups; alkoxynaphthyl groups such as methoxynaphthyl and ethoxynaphthyl groups; dialkylnaphthyl groups such as dimethylnaphthyl and diethylnaphthyl groups; and dialkoxynaphthyl groups such as dimethoxynaphthyl and diethoxynaphthyl groups. Examples of aralkyl groups include benzyl, phenylethyl, and phenethyl groups. Examples of aryloxyalkyl groups include 2-aryl-2-oxoethyl groups such as 2-phenyl-2-oxoethyl, 2-(1-naphthyl)-2-oxoethyl, and 2-(2-naphthyl)-2-oxoethyl groups. Examples of the non-nucleophilic counter ions represented by K⁻ includes: halide ions such as chloride ions and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

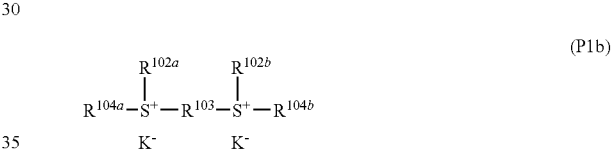

Wherein $R^{102a}$ and $R^{102b}$ each represent linear, branched or cyclic alkyl groups having 1 to 8 carbon atoms;

$R^{103}$ represents a linear, branched or cyclic alkylene group having 1 to 10 carbon atoms;

$R^{104a}$ and $R^{104b}$ each represent 2-oxoalkyl groups having 3 to 7 carbon atoms; and K⁻ represents a non-nucleophilic counter ion.

Examples of $R^{102a}$ and $R^{102b}$ concretely include methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Examples of $R^{103}$ include methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Examples of $R^{104a}$ and $R^{104b}$ include 2-oxopropyl, 2-oxocyclopentyl, 2-oxocyclohexyl, and 2-oxocycloheptyl. Examples of K⁻ includes the same ones as explained for the formulae (P1a-1), (P1a-2) and (P1a-3).

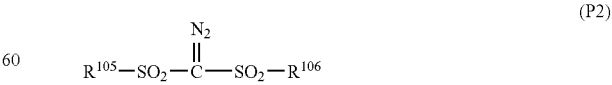

wherein $R^{105}$ and $R^{106}$ represent linear, branched or cyclic alkyl or halogenated alkyl groups having 1 to 12 carbon atoms, substituted or unsubstituted aryl or halogenated aryl groups having 6 to 20 carbon atoms, or aralkyl groups having 7 to 12 carbon atoms.

Examples of alkyl groups represented by $R^{105}$ and $R^{106}$ include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl groups. Examples of halogenated alkyl groups include trifluoromethyl, 1,1,1-trifluoroethyl, 1,1,1-trichloroethyl, and nonafluorobutyl groups. Examples of aryl groups include a phenyl group; alkoxyphenyl groups such as p-methoxyphenyl, m-methoxyphenyl, o-methoxyphenyl, ethoxyphenyl, p-tert-butoxyphenyl, and m-tert-butoxyphenyl groups; and alkylphenyl groups such as 2-methylphenyl, 3-methylphenyl, 4-methylphenyl, ethylphenyl, 4-tert-butylphenyl, 4-butylphenyl, and dimethylphenyl groups. Examples of halogenated aryl groups include fluorophenyl, chlorophenyl, and 1,2,3,4,5-pentafluorophenyl groups. Examples of aralkyl groups include benzyl and phenethyl groups.

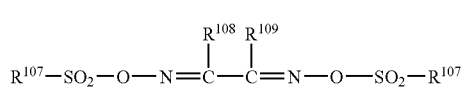
(P3)

wherein $R^{107}$, $R^{108}$, and $R^{109}$ represent linear, branched or cyclic alkyl or halogenated alkyl groups having 1 to 12 carbon atoms, aryl or halogenated aryl groups having 6 to 20 carbon atoms, or aralkyl groups having 7 to 12 carbon atoms;

wherein $R^{108}$ and $R^{109}$ each may form a ring together, and when a ring is formed, $R^{108}$ and $R^{109}$ each represent an alkylene group having 1 to 6 carbon atoms.

Examples of the alkyl, halogenated alkyl, aryl, halogenated aryl, and aralkyl groups represented by $R^{107}$, $R^{108}$, and $R^{109}$ are the same as those explained for $R^{105}$ and $R^{106}$. Note that examples of alkylene groups represented by $R^{108}$ and $R^{109}$ include methylene, ethylene, propylene, butylene, and hexylene groups.

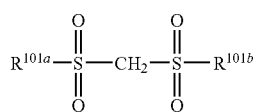
(P4)

wherein $R^{101a}$ and $R^{101b}$ are same as the above.

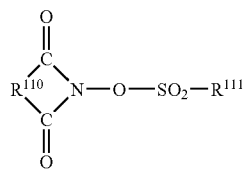
(P5)

wherein $R^{110}$ represents an arylene group having 6 to 10 carbon atoms, alkylene group having 1 to 6 carbon atoms, or alkenylene group having 2 to 6 carbon atoms wherein some or all of the hydrogen atoms included in these groups may be additionally substituted with linear or branched alkyl or alkoxy groups having 1 to 4 carbon atoms, nitro, acetyl, or phenyl groups;

$R^{111}$ represents a linear, branched, or substituted alkyl group having 1 to 8 carbon atoms, alkenyl, alkoxyalkyl, phenyl or naphthyl groups;

wherein some or all of the hydrogen atoms of these groups may be additionally substituted with: an alkyl or alkoxy group having 1 to 4 carbon atoms; a phenyl group which may be substituted with an alkyl or alkoxy group having 1 to 4 carbon atoms, nitro, or acetyl group; a hetero-aromatic group having 3 to 5 carbon atoms; or chlorine or fluorine atom.

For $R^{110}$, examples of the arylene group include 1,2-phenylene and 1,8-naphthylene; examples of the alkylene group include methylene, ethylene, trimethylene, tetramethylene, phenylethylene, and norbornane-2,3-diyl groups; and examples of the alkenylene group include 1,2-vinylene, 1-phenyl-1,2-vinylene, and 5-norbornene-2,3-diyl groups. For $R^{111}$, examples of the alkyl groups include: the same ones as those for $R^{101a}$ to $R^{101c}$; examples of the alkenyl group include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl groups; and examples of the alkoxyalkyl group include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl groups.

For the additional substitution groups, examples of the alkyl group having 1 to 4 carbon atoms include methyl, ethyl, propyl, isopropyl, n-butyl, isobutyl and tert-butyl; examples of the alkoxy group having 1 to 4 carbon atoms include methoxy, ethoxy, propoxy, isopropoxy, n-butoxy, isobutoxy, and tert-butoxy; examples of the phenyl group, which may be substituted with an alkyl or alkoxy group having 1 to 4 carbon atoms, nitro, or acetyl group, include phenyl, tolyl, p-tert-butoxyphenyl, p-acetylphenyl and p-nitrophenyl groups; and examples of the hetero-aromatic groups having 3 to 5 carbon atoms include pyridyl and furyl groups.

Concretely, examples of the above include photoacid generators listed below:

Onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocyclohexyl)sulfonium trifluoromethanesulfonate, ethylenebis[methyl(2-oxocyclopentyl)sulfonium trifluoromethanesulfonate], and 1,2'-naphthylcarbonylmethyltetrahydrothiophenium triflate.

Diazomethane derivatives such as bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane.

Glyoxime derivatives such as bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-β-(trifluoromethanesulfonyl)-α-dimethylglyoxime, bis-β-(1,1,1-trifluoroethanesulfonyl)-α-dimethylglyoxime, bis-O-(tert-butanesulfony)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime.

Bissulfone derivatives such as bisnaphthylsulfonylmethane, bistrifluoromethylsulfonylmethane, bismethylsulfonylmethane, bisethylsulfonylmethane, bispropylsulfonylmethane, bisisopropylsulfonylmethane, bis-p-toluenesulfonylmethane, and bisbenzenesulfonylmethane;

β-ketosulfonic acid derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate; and sulfonate ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene.

Sulfonate ester derivatives of N-hydroxyimide compounds, or the like, such as: N-hydroxysuccinimide methanesulfonate, N-hydroxysuccinimide trifluoromethanesulfonate, N-hydroxysuccinimide ethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide 1-octanesulforiate, N-hydroxysuccinimide p-toluenesulfonate, N-hydroxysuccinimide p-methoxybenzenesulfonate, N-hydroxysuccinimide 2-chloroethanesulfonate, N-hydroxysuccinimide benzenesulfonate, N-hydroxysuccinimide 2,4,6-trimethylbenzenesulfonate, N-hydroxysuccinimide 1-naphthalenesulfonate, N-hydroxysuccinimide 2-naphthalenesulfonate, N-hydroxy-2-phenylsuccinimide methanesulfonate, N-hydroxymaleimide methanesulfonate, N-hydroxymaleimide ethanesulfonate, N-hydroxy-2-phenylmaleimide methanesulfonate, N-hydroxyglutarimide methanesulfonate, N-hydroxyglutarimide benzenesulfonate, N-hydroxyphthalimide methanesulfonate, N-hydroxyphthalimide benzenesulfonate, N-hydroxyphthalimide trifluoromethanesulfonate, N-hydroxyphthalimide p-toluenesulfonate, N-hydroxynaphthalimide methanesulfonate, N-hydroxynaphthal imide benzenesulfonate, N-hydroxy-5-norbornene-2,3-dicarboxylmide methanesulfonate, N-hydroxy-5-norbornene-2,3-dicarboxylmide trifluoromethanesulfonate, and N-hydroxy-5-norbornene-2,3-dicarboxylmide p-toluenesulfonate.

Particularly preferably used among them are:

onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocylohexyl)sulfonium trifluoromethanesulfonate, 1,2'-naphthylcarbonylmethyltetrahydrothiophenium triflate;

diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, and bis(tert-butylsulfonyl)diazomethane;

glyoxime derivatives such as bis-O-(p-toluenesulfonyl)-α-dimethylglyoxime and bis-O-(n-butanesulfonyl)-α-dimethylglyoxime;

bissulfone derivatives such as bisnaphthylsulfonylmethane; and sulfonate ester derivatives of N-hydroxyimide compounds such as N-hydroxysuccinimide methanesulfonate, N-hydroxysuccinimide trifluoromethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide p-toluenesulfonate, N-hydroxynaphthalimide methanesulfonate, and N-hydroxynaphthalimide benzenesulfonate.

The photoacid generators can be used solely in one kind or combinedly in two or more kinds. The addition amount of the photoacid generator is preferably 0.01 to 50 parts by mass, more preferably 0.05 to 40 parts by mass relative to 100 parts by mass of base polymer (i.e., the silicon-containing compound obtained by the above procedure).

It is possible to blend a surfactant to the composition for forming the silicon-containing film which is removable by the present invention, as required. Here, the surfactant is preferably nonionic, and examples thereof include perfluoroalkyl polyoxyethylene ethanols, fluorinated alkyl esters, perfluoroalkylamine oxides, perfluoroalkyl ethylene oxide adducts, and fluorine containing organosiloxanes. Examples thereof include Fluorad "FC-430", "FC-431", and "FC-4430" (all produced by Sumitomo 3M Co., Ltd.), SURFLON "S-141", "S-145", "KH-10", "KH-20", "KH-30", and "KH-40" (all produced by ASAHI GLASS CO., Unidain "DS-401", "DS-403", and "DS-451" (all produced by Daikin Industries Ltd.), MEGAFAC "F-8151" (produced by DAINIPPON INK AND CHEMICALS, INCORPORATED), and "X-70-092" and "X-70-093" (both produced by Shin-Etsu Chemical Co., Ltd.). Preferable examples include Fluorad "FC-4430", "KH-20", "KH-30", and "X-70-093".

Note that the addition amount of the surfactant may be a typical amount within such a range not to obstruct the effect of the present invention, and the addition amount is preferably 0 to 10 parts by mass, particularly 0 to 5 parts by mass relative to 100 parts by mass of the base polymer.

Further, the composition for forming the silicon-containing film which is removable by the present invention can be improved in stability, by adding thereto, as a stabilizer, a monovalent or divalent or higher alcohol having a cyclic ether as a substitutional group, particularly ether compounds represented by the following formulae, as required: Examples thereof include the following compounds:

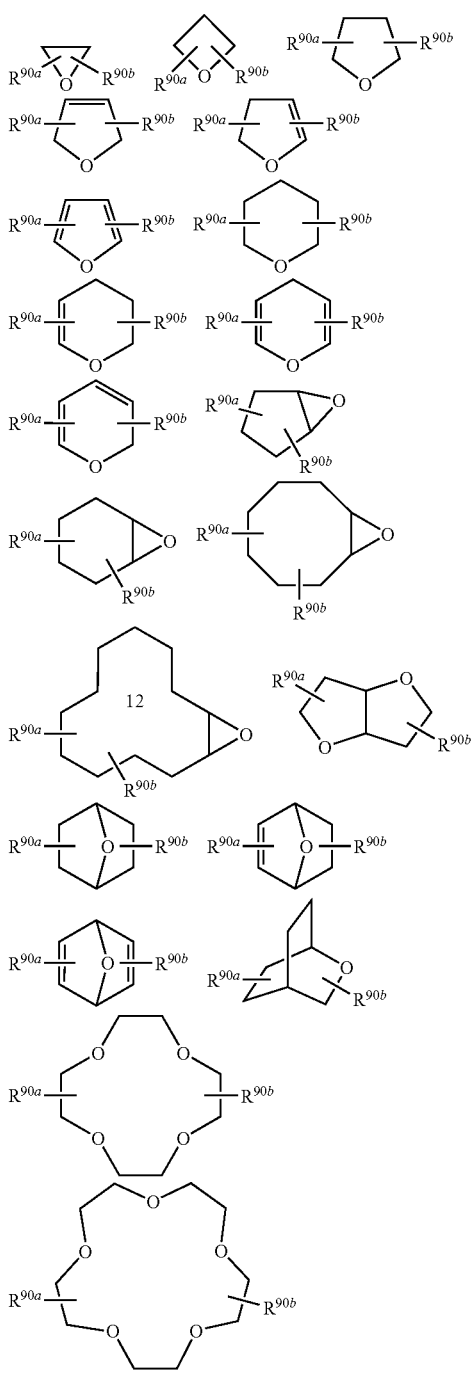

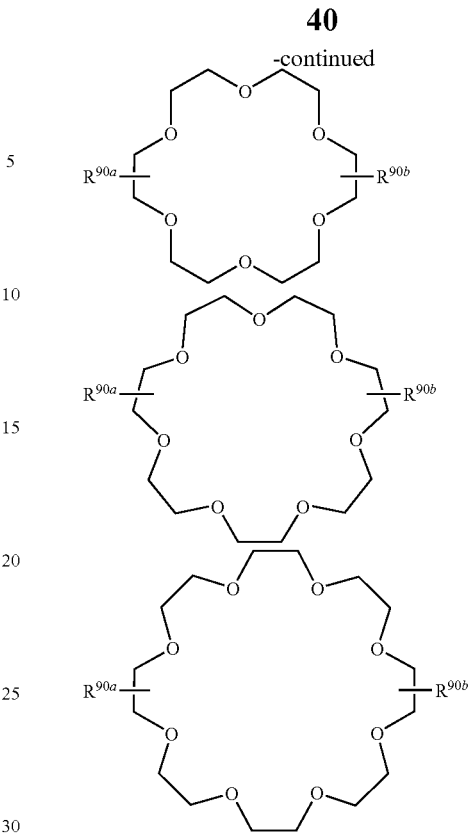

wherein $R^{90a}$ is: a hydrogen atom; a linear, branched or cyclic monovalent hydrocarbon group having 1 to 10 carbon atoms; $R^{91}O-(CH_2CH_2O)_{n1}-(CH_{12})_{n2}-$ (where $0 \leq n1 \leq 5$, $0 \leq n2 \leq 3$, and $R^{91}$ is a hydrogen atom or methyl group); or $R^{92}O-[CH(CH_3)CH_2O]_{n3}-(CH_2)_{n4}-$ (where $0 \leq n3 \leq 5$, $0 \leq n4 \leq 3$, and $R^{92}$ is a hydrogen atom or methyl group); and $R^{90b}$ is: a hydroxyl group; a linear, branched or cyclic monovalent hydrocarbon group having 1 to 10 carbon atoms having one or two or more hydroxyl groups; HO—$(CH_2CH_2O)_{n5}-(CH_2)_{n6}-$ (where $1 \leq n5 \leq 5$, and $1 \leq n6 \leq 3$); or HO—$[CH(CH_3)CH_2O]_{n7}-(CH_2)_{n8}-$ (where $1 \leq n7 \leq 5$, and $1 \leq n8 \leq 3$).

The silicon-containing film which is capable of being removed by the process of the present invention can be formed on a substrate from the silicon-containing film-forming composition by spin coating or the like. In the case of the silicon-containing film is used for the silicon-containing film of multi-layer resist film, after spin coating, the composition is desirably baked, so as to evaporate the solvent therein, and to promote crosslinking reaction for preventing the film from being mixed with the overlying photoresist film. Baking is to be preferably conducted within a temperature range of 50 to 500° C. and within a time range of 10 to 300 seconds. Particularly preferably, the temperature range is 400° C. or lower for decreased thermal damage against a device to be produced, depending on the structure thereof.

The silicon-containing film stripping process of the present invention is conducted in the following manner. As the first step, a silicon-containing film formed on a substrate is treated with an acidic stripping solution containing sulphate ion and/or fluoride ion. Thereafter, pure water rinsing or the like is conducted to remove the stripping solution used in the first step, without damaging a circuit placed on a wafer. As the second step thereafter, treatment with an alkaline stripping solution containing a nitrogen compound is conducted.

Thereafter, pure water rinsing or the like is again conducted, to remove the stripping solution used in the second step. Note that, as the cleaning to be conducted after the respective steps, it is possible to select a cleaning method other than pure water rinsing, such as cleaning based on ultrasonic waves, organic solvent, and the like, which is capable of completely removing a used stripping solution without damaging a circuit on a wafer.

EXAMPLES

Although the present invention will be concretely explained by describing Examples and Comparative Examples, the present invention is not limited by the description.

Synthesis Example 1

Charged into a 1,000 ml glass flask were 200 g of methanol, 200 g of ion exchange water, and 1 g of 35% hydrochloric acid; and a mixture of 50 g of tetraethoxysilane, 100 g of methyltrimethoxysilane, and 10 g of phenyltrimethoxysilane was added thereinto at a room temperature. The resultant mixture was kept as it was for 8 hours at a room temperature to thereby subject it to hydrolytic condensation; and then 300 ml of propylene glycol monoethyl ether was added into the mixture, followed by concentration under reduced pressure, to obtain 300 g of a propylene glycol monoethyl ether solution of a silicon-containing compound 1 (polymer concentration of 21%). The silicon-containing compound 1 was measured for a molecular weight relative to polystyrene standards, and determined to be Mw=2,000.

Synthesis Example 2

300 g of a propylene glycol monoethyl ether solution of a silicon-containing compound 2 (polymer concentration of 19%) was obtained by the same procedure as Synthesis Example 1, except that the mixture of 50 g of tetraethoxysilane, 100 g of methyltrimethoxysilane, and 10 g of phenyltrimethoxysilane was changed to 100 g of methyltrimethoxysilane and 20 g of phenyltrimethoxysilane. The silicon-containing compound 2 was measured for a molecular weight relative to polystyrene standards, and determined to be Mw=3,000.

Synthesis Example 3

300 g of a butanediol monomethyl ether solution of a silicon-containing compound 3 (polymer concentration of 20%) was obtained by the same procedure as Synthesis Example 1, except that 200 g of methanol, 200 g of ion exchange water, 1 g of 35% hydrochloric acid, 50 g of tetraethoxysilane, 100 g of methyltrimethoxysilane, 10 g of phenyltrimethoxysilane, and propylene glycol monoethyl ether in Synthesis Example 1 were changed to 260 g of ion exchange water, 5 g of 65% nitric acid, 70 g of tetramethoxysilane, 70 g of methyltrimethoxysilane, 10 g of phenyltrimethoxysilane, and butanediol monomethyl ether. The silicon-containing compound 3 was measured for a molecular weight relative to polystyrene standards, and determined to be Mw=2,500.

Synthesis Example 4

Charged into a 1,000 ml glass flask were 260 g of ion exchange water and 1 g of 35% hydrochloric acid; and a mixture of 70 g of tetramethoxysilane, 25 g of methyltrimethoxysilane, 25 g of a silane compound represented by the following formula [i], and 10 g of phenyltrimethoxysilane was added thereinto at a room temperature. The resultant mixture was kept as it was for 8 hours at a room temperature, to thereby subject it to hydrolytic condensation; and then a by-product methanol was distilledly removed therefrom under reduced pressure. Added into the resultant mixture were 800 ml of ethyl acetate and 300 ml of propylene glycol monopropyl ether, and a water layer was separated from the resultant mixture. Added to the remaining organic layer was 100 ml of ion exchange water, followed by stirring, still standing, and separation. This was repeated three times. Added to the remaining organic layer was 200 ml of propylene glycol monopropyl ether, followed by concentration thereof under reduced pressure, thereby obtaining 300 g of a propylene glycol monopropyl ether solution of a silicon-containing compound 4 (polymer concentration of 20%). The obtained solution was analyzed for chlorine by ion chromatograph, and such ions were not detected. The silicon-containing compound 4 was measured for a molecular weight relative to polystyrene standards, and determined to be Mw=1,800.

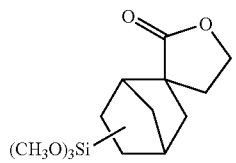

[i]

Synthesis Example 5

Charged into a 1,000 ml glass flask were 200 g of ethanol, 100 g of ion exchange water, and 3 g of methanesulfonic acid; and a mixture of 40 g of tetramethoxysilane, 10 g of methyltrimethoxysilane, 50 g of a silane compound represented by the following formula [ii], and 10 g of phenyltrimethoxysilane was added thereinto at a room temperature. The resultant mixture was kept as it was for 8 hours at a room temperature, to thereby subject it to hydrolytic condensation; and then a by-product methanol was distilledly removed therefrom under reduced pressure. Added into the resultant mixture were 800 ml of ethyl acetate and 300 ml of ethylene glycol monopropyl ether, and a water layer was separated from the resultant mixture. Added to the remaining organic layer was 100 ml of ion exchange water, followed by stirring, still standing, and separation. This was repeated three times. Added to the remaining organic layer was 200 ml of ethylene glycol monopropyl ether, followed by concentration thereof under reduced pressure, thereby obtaining 300 g of an ethylene glycol monopropyl ether solution of a silicon-containing compound 5 (polymer concentration of 20%). The obtained solution was analyzed for methanesulfonic acid ion by ion chromatograph, and it was revealed that 99% of such ions used for the reaction were removed. The silicon-containing compound 5 was measured for a molecular weight relative to polystyrene standards, and determined to be Mw=2,100.

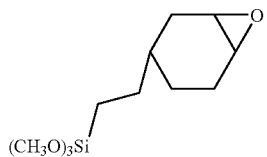

Synthesis Example 6

Added into a mixture of 40 g of propylene glycol methyl ether, 1 g of methanesulfonic acid, and 50 g of deionized water, was a mixture of 10 g of phenyltrimethoxysilane, 20 g of 2-(3,4-epoxycyclohexyl)ethyltrimethoxysilane, 10 g of tetrabutoxy germanium, and 35 g of propylene glycol methyl ether; the resultant mixture was kept as it was for 12 hours at 40° C. to thereby subject it to hydrolytic condensation; and then by-product alcohols were distilledly removed therefrom under reduced pressure. Added to the resultant mixture were 800 ml of ethyl acetate and 300 ml of propylene glycol methyl ether, and a water layer was separated from the resultant mixture. Added to the remaining organic layer was 100 ml of ion exchange water, followed by stirring, still standing, and separation. This was repeated three times. Added to the remaining organic layer was 200 ml of propylene glycol methyl ether, followed by concentration thereof under reduced pressure, thereby obtaining 100 g of a propylene glycol methyl ether solution of a silicon-containing compound 6 (polymer concentration of 20%). The obtained solution was analyzed for methanesulfonic acid ion by ion chromatograph, and such ions were not detected. The silicon-containing compound 6 was measured for a molecular weight relative to polystyrene standards, and determined to be Mw=3,000.

Synthesis Example 7

Added into a mixture of 40 g of propylene glycol methyl ether, 1 g of methanesulfonic acid, and 50 g of deionized water, was a mixture of 10 g of phenyltrimethoxysilane, 20 g of 2-(3,4-epoxycyclohexyl)ethyltrimethoxysilane, 10 g of tetrabutoxy titanium, 20 g of 2,4-pentanedione, and 35 g of propylene glycol methyl ether; the resultant mixture was kept as it was for 12 hours at 30° C. to thereby subject it to hydrolytic condensation; and then by-product alcohols were distilledly removed therefrom under reduced pressure. Added to the remaining solution was 200 ml of propylene glycol methyl ether, followed by concentration thereof under reduced pressure, thereby obtaining 120 g of a propylene glycol methyl ether solution of a silicon-containing compound 7 (polymer concentration of 20%). The silicon-containing compound 7 was measured for a molecular weight relative to polystyrene standards, and determined to be Mw=8,000.

Synthesis Example 8

Added into a mixture of 200 g of ethanol, 100 g of ion exchange water, and 3 g of methanesulfonic acid, was a mixture of 40 g of tetramethoxysilane, 10 g of methyltrimethoxysilane, 50 g of trimethyl borate, and 10 g of phenyltrimethoxysilane, at a room temperature. The resultant mixture was kept as it was for 8 hours at the room temperature to thereby subject it to hydrolytic condensation; and then a by-product methanol was distilledly removed therefrom under reduced pressure. Added to the resultant mixture were 800 ml of ethyl acetate and 300 ml of ethylene glycol monopropyl ether, and a water layer was separated from the resultant mixture. Added to the remaining organic layer was 100 ml of ion exchange water, followed by stirring; still standing, and separation. This was repeated three times. Added to the remaining organic layer was 200 ml of ethylene glycol monopropyl ether, followed by concentration thereof under reduced pressure, thereby obtaining 300 g of an ethylene glycol monopropyl ether solution of a silicon-containing compound 8 (polymer concentration of 20%). The obtained solution was analyzed for methanesulfonic acid ion by ion chromatography, and it was revealed that 99% of such ions used for the reaction were removed. The silicon-containing compound 8 was measured for a molecular weight relative to polystyrene standards, and determined to be Mw=2,100.

Examples 1 to 10, and Comparative Examples 1 to 3

The silicon-containing compounds 1 to 8 obtained in the Synthesis Examples, an organic acid, a thermal crosslinking accelerator, a solvent, and additives were mixed with one another at ratios listed in Table 1, respectively, followed by filtration by a filter made of fluororesin of a 0.1 μm size, to prepare silicon-containing film-forming composition solutions (silicon-containing film materials) named Sol. 1 to 10, respectively.

TABLE 1

| | No. | Silicon-containing compound (parts by mass) | Thermal cross-linking accelerator (parts by mass) | Organic acid (parts by mass) | Solvent (parts by mass) | Water/Cross-linking agent (parts by mass) | Additives (parts by mass) |
|---|---|---|---|---|---|---|---|
| Production Example 1 | Sol. 1 | Compound 1 (4.0) | TPSOAc (0.04) | Maleic acid (0.04) | propylene glycol monoethyl ether (100) | Water (10) | — |
| Production Example 2 | Sol. 2 | Compound 2 (4.0) | TPSOH (0.04) | Oxalic acid (0.02) | propylene glycol monoethyl ether (100) | Water (5) | — |
| Production Example 3 | Sol. 3 | Compound 3 (4.0) | TPSCl (0.04) TMAOAc (0.003) | Maleic acid (0.01) | butane diol monomethyl ether (100) | Water (5) | — |

TABLE 1-continued

| No. | | Silicon-containing compound (parts by mass) | Thermal cross-linking accelerator (parts by mass) | Organic acid (parts by mass) | Solvent (parts by mass) | Water/Cross-linking agent (parts by mass) | Additives (parts by mass) |
|---|---|---|---|---|---|---|---|
| Production Example 4 | Sol. 4 | Compound 4 (4.0) | TPSMA (0.04) TMAOAc (0.003) | Maleic acid (0.01) Oxalic acid (0.01) | propylene glycol monopropyl ether (100) | Water (5) | — |
| Production Example 5 | Sol. 5 | Compound 5 (4.0) | TPSN (0.04) | Maleic acid (0.01) Oxalic acid (0.01) | ethylene glycol monopropyl ether (100) | Water (5) | — |
| Production Example 6 | Sol. 6 | Compound 6 (4.0) | TPSMA (0.04) | Maleic acid (0.01) | propylene glycol monoethyl ether (100) | Water (5) | — |
| Production Example 7 | Sol. 7 | Compound 7 (4.0) | TPSOAc (0.04) | Maleic acid (0.01) | propylene glycol monoethyl ether (100) | Water (5) | — |
| Production Example 8 | Sol. 8 | Compound 8 (1.0) Compound 1 (3.0) | TPSOAc (0.04) | Maleic acid (0.01) | propylene glycol monoethyl ether (100) | Water (5) | — |
| Production Example 9 | Sol. 9 | Compound 1 (4.0) | TPSMA (0.04) | Maleic acid (0.01) | propylene glycol monoethyl ether (100) | Water (3) Cross-linking agent 1 (5) | TPSNf (0.02) |
| Production Example 10 | Sol. 10 | Compound 1 (4.0) | TPSOAc (0.04) | Maleic acid (0.01) | propylene glycol monoethyl ether (100) | Water (0) Cross-linking agent 1 (5) | — |

TPSOAc: triphenylsulfonium acetate (photo-degradable thermal crosslinking accelerator)
TPSOH: triphenylsulfonium hydroxide (photo degradable thermal crosslinking accelerator)
TPSCl: triphenylsulfonium chloride (photo-degradable thermal crosslinking accelerator)
TPSMA: mono(triphenylsulfonium) maleate (photo-degradable thermal crosslinking accelerator)
TPSN: triphenylsulfonium nitrate (photo-degradable thermal crosslinking accelerator)
TMAOAc: tetramethylammonium acetate (non-photo-degradable thermal crosslinking accelerator)
TPSNf: triphenylsulfonium nonafluorobutanesulfonate (photoacid generator)
Crosslinking agent 1

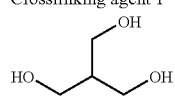

The Sol. 1 to 10 prepared above were each spin coated onto a substrate, followed by heating at 200° C. for one minute for film formation, to form a silicon-containing film having a thickness of 100 nm.

Subsequently, the silicon-containing films formed in the above were each subjected to a stripping treatment according to a first step under the following conditions by an applicable acidic stripping solution containing sulphate ion and/or fluoride ion shown in Table 2 below. Thereafter, pure water rinsing was conducted to remove the applicable stripping solution used in the first step, and then a stripping treatment according to a second step was conducted under the following conditions by an applicable alkaline stripping solution containing a nitrogen compound shown in Table 2. Thereafter, pure water rinsing was conducted to remove the applicable stripping solution used in the second step. Note that DMSO in Table 2 represents dimethyl sulfoxide.

TABLE 2

| | No. | First step Composition of stripping solution (parts by mass) | Temperature | Treatment time | Second step Composition of stripping solution (parts by mass) | Temperature | Treatment time |
|---|---|---|---|---|---|---|---|
| Example 1 | Sol. 1 | $H_2SO_4/H_2O_2/H_2O$ = 96/1/3 | 80° C. | 5 minutes | $NH_4OH/H_2O_2/H_2O$ = 2/3/95 | 80° C. | 5 minutes |
| Example 2 | Sol. 2 | $H_2SO_4/H_2O_2/H_2O$ = 85/5/10 | 80° C. | 5 minutes | $NH_4OH/H_2O_2/H_2O$ = 2/3/95 | 80° C. | 5 minutes |
| Example 3 | Sol. 3 | $H_2SO_4/H_2O_2/H_2O$ = 80/6/14 | 80° C. | 5 minutes | $(CH_3)_3N/H_2O_2/H_2O$ = 3/3/94 | 80° C. | 5 minutes |
| Example 4 | Sol. 4 | $H_2SO_4/H_2O_2/H_2O$ = 96/1/3 | 120° C. | 5 minutes | $(CH_3)_4NOH/H_2O_2/H_2O$ = 3/3/94 | 80° C. | 5 minutes |
| Example 5 | Sol. 5 | $H_2SO_4/H_2O_2/H_2O$ = 96/1/3 | 120° C. | 5 minutes | $NH_4OH/H_2O_2/H_2O$ = 2/3/95 | 80° C. | 5 minutes |
| Example 6 | Sol. 6 | $DMSO/H_2O/NH_4F$ = 60/35/5 | 100° C. | 5 minutes | $NH_4OH/H_2O_2/H_2O$ = 1/2/95 | 80° C. | 5 minutes |
| Example 7 | Sol. 7 | $HF/NH_4F/H_2O$ = 5/5/90 | 80° C. | 5 minutes | $NH_4OH/H_2O_2/H_2O$ = 2/3/95 | 80° C. | 5 minutes |
| Example 8 | Sol. 8 | $H_2SO_4/H_2O_2/H_2O$ = 96/1/3 | 120° C. | 5 minutes | $(CH_3)_4NOH/H_2O_2/H_2O$ = 3/3/94 | 80° C. | 5 minutes |
| Example 9 | Sol. 9 | $H_2SO_4/H_2O_2/H_2O$ = 96/1/3 | 120° C. | 5 minutes | $(CH_3)_4NOH/H_2O_2/H_2O$ = 3/3/94 | 80° C. | 5 minutes |
| Example 10 | Sol. 10 | $H_2SO_4/H_2O_2/H_2O$ = 96/1/3 | 120° C. | 5 minutes | $(CH_3)_4NOH/H_2O_2/H_2O$ = 3/3/94 | 80° C. | 5 minutes |
| Comparative Example 1 | Sol. 1 | $H_2SO_4/H_2O_2/H_2O$ = 96/1/3 | 80° C. | 5 minutes | — | | |
| Comparative Example 2 | Sol. 1 | $NH_4OH/H_2O_2$ = 90/10 | 80° C. | 5 minutes | — | | |
| Comparative Example 3 | Sol. 1 | $HF/NH_4F/H_2O$ = 5/5/90 | 80° C. | 5 minutes | — | | |

Thicknesses of the silicon-containing films after stripping were measured. Measurement results are shown in Table 3.

TABLE 3

| | Thicknesses of film |
|---|---|
| Example 1 | 0 nm |
| Example 2 | 0 nm |
| Example 3 | 0 nm |
| Example 4 | 0 nm |
| Example 5 | 0 nm |
| Example 6 | 0 nm |
| Example 7 | 0 nm |
| Example 8 | 0 nm |
| Example 9 | 0 nm |
| Example 10 | 0 nm |
| Comparative Example 1 | 95 nm |
| Comparative Example 2 | 92 nm |
| Comparative Example 3 | 90 nm |

From the results of Table 3, it was revealed that silicon-containing films were never left in all Examples. It was further revealed that stripping was incomplete, in case of adoption of either the applicable acidic stripping solution containing sulphate ion and/or fluoride ion, or the applicable alkaline stripping solution containing the nitrogen compound, in the stripping process. Further, as a result of microscopic observation, no damages due to the stripping treatment were found in patterns of substrates after the stripping process in Examples. From the above, the process of the present invention allows a silicon-containing film for lithography, which has not been conventionally removed unless dry stripping is adopted, to be removed by the stripping process based on the stripping solution (wet stripping process), without causing damages.

The present invention is not limited to the above embodiments. The above embodiments are merely illustrative, and whatever having the substantially same configurations as the technical concept recited in the claims of the present application and exhibiting the same functions and effects are embraced within the technical scope of the present invention.

What is claimed is:

1. A coated-type silicon-containing film stripping process for removing a coated-type silicon-containing film obtained by coating a silicon-containing film composition derived from material containing $Si(OR)_4$ used in a lithography on a substrate, wherein R is an alkyl group having 1 to 3 carbon atoms, comprising, at least:
    a first step of treating the silicon-containing film with an acidic stripping solution containing sulphate ion; and
    a second step of treating the silicon-containing film with an alkaline stripping solution containing tetraalkyl ammonium.

2. The coated-type silicon-containing film stripping process according to claim 1, wherein the acidic stripping solution containing sulphate ion to be used in the first step further contains hydrogen peroxide.

3. The coated-type silicon-containing film stripping process according to claim 1, wherein the alkaline stripping solution containing tetraalkyl ammonium to be used in the second step further contains hydrogen peroxide.

4. The coated-type silicon-containing film stripping process according to claim 2, wherein the alkaline stripping solution containing tetraalkyl ammonium to be used in the second step further contains hydrogen peroxide.

5. The coated-type silicon-containing film stripping process according to claim 1, further comprising
    after the first step, removing the acidic stripping solution containing sulphate ion used in the first step, and after the second step, removing the alkaline stripping solution containing tetraalkyl ammonium used in the second step.

6. The coated-type silicon-containing film stripping process according to claim 2, further comprising after the first step, removing the acidic stripping solution containing sulphate ion used in the first step, and after the second step, removing the alkaline stripping solution containing tetraalkyl ammonium used in the second step.

7. The coated-type silicon-containing film stripping process according to claim 1, wherein the second step for treating the silicon-containing film by the alkaline stripping solution containing tetraalkyl ammonium is configured to use the alkaline stripping solution containing tetraalkyl ammonium at a temperature of 50° C. to 90° C.

8. The coated-type silicon-containing film stripping process according to claim 7, wherein the second step for treating the silicon-containing film by the alkaline stripping solution containing tetraalkyl ammonium is configured to use the alkaline stripping solution containing tetraalkyl ammonium at a temperature of 50° C. to 90° C.

* * * * *